(12) United States Patent
Chen et al.

(10) Patent No.: US 11,901,412 B2
(45) Date of Patent: Feb. 13, 2024

(54) FACET-FREE EPITAXIAL STRUCTURES FOR SEMICONDUCTOR DEVICES

(71) Applicant: Taiwan Semicondutor Manufacturing Co., Ltd., Hsinchu (TW)

(72) Inventors: Winne Victoria Wei-Ning Chen, Zhubei (TW); Pang-Yen Tsai, Jhu-bei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 346 days.

(21) Appl. No.: 17/461,178

(22) Filed: Aug. 30, 2021

(65) Prior Publication Data
US 2023/0064593 A1 Mar. 2, 2023

(51) Int. Cl.
*H01L 29/08* (2006.01)
*H01L 21/308* (2006.01)
*H01L 21/8238* (2006.01)
*H01L 29/66* (2006.01)
*H01L 29/786* (2006.01)
*H01L 27/092* (2006.01)
*H01L 29/78* (2006.01)

(52) U.S. Cl.
CPC ...... *H01L 29/0847* (2013.01); *H01L 21/3081* (2013.01); *H01L 21/823821* (2013.01); *H01L 27/0924* (2013.01); *H01L 29/66742* (2013.01); *H01L 29/66795* (2013.01); *H01L 29/78618* (2013.01); *H01L 29/785* (2013.01); *H01L 29/78696* (2013.01)

(58) Field of Classification Search
CPC ............. H01L 29/0847; H01L 21/3081; H01L 21/823821; H01L 27/0924; H01L 29/66742; H01L 29/66795; H01L 29/78618; H01L 29/785; H01L 29/78696; H01L 21/823814; H01L 27/092; H01L 29/1079; H01L 29/165; H01L 29/267; H01L 29/7848; H01L 21/3065; H01L 21/32137; H01L 29/0673; H01L 29/42392; H01L 29/66439; H01L 29/775; H01L 21/31116; H01L 29/7855; B82Y 10/00
See application file for complete search history.

(56) References Cited

U.S. PATENT DOCUMENTS 9,093,530 B2 7/2015 Huang et al.
9,171,929 B2 10/2015 Lee et al.
(Continued)

*Primary Examiner* — Fernando L Toledo
*Assistant Examiner* — Adam S Bowen
(74) *Attorney, Agent, or Firm* — Sterne, Kessler, Goldstein & Fox P.L.L.C.

(57) ABSTRACT

The present disclosure describes a semiconductor device having facet-free epitaxial structures with a substantially uniform thickness. The semiconductor device includes a fin structure on a substrate. The fin structure includes a fin bottom portion and a fin top portion. A top surface of the fin bottom portion is wider than a bottom surface of the fin top portion. The semiconductor device further includes a dielectric layer on the fin top portion, an amorphous layer on the dielectric layer, and an epitaxial layer. The epitaxial layer is on a top surface of the amorphous layer, sidewall surfaces of the amorphous layer, the dielectric layer, the fin top portion, and the top surface of the fin bottom portion.

20 Claims, 37 Drawing Sheets

(56) References Cited

U.S. PATENT DOCUMENTS

| | | |
|---|---|---|
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 2017/0053912 A1* | 2/2017 | Ching .................. H01L 29/785 |
| 2018/0261514 A1* | 9/2018 | Xie .................. H01L 21/28185 |

* cited by examiner

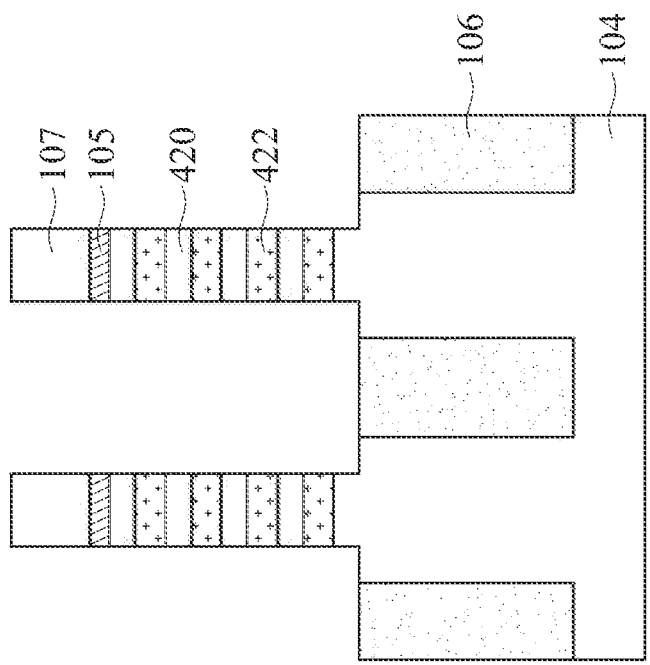
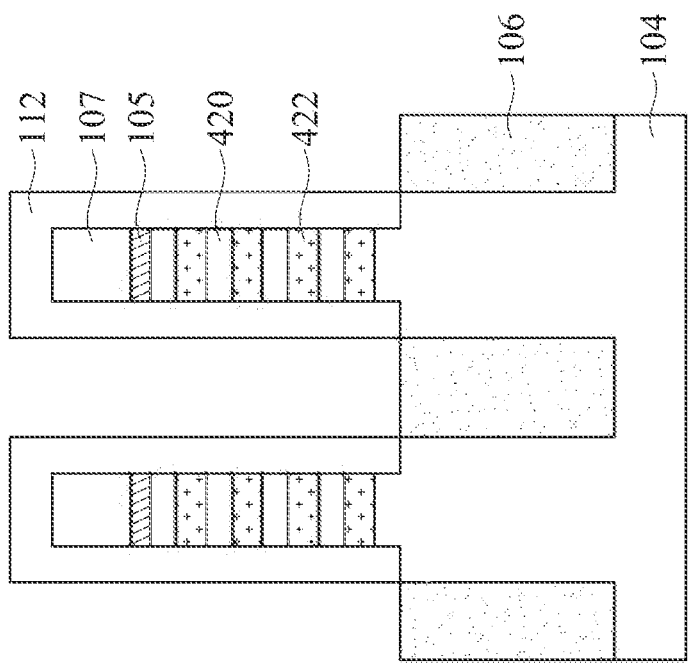
FIG. 30A
FIG. 30B

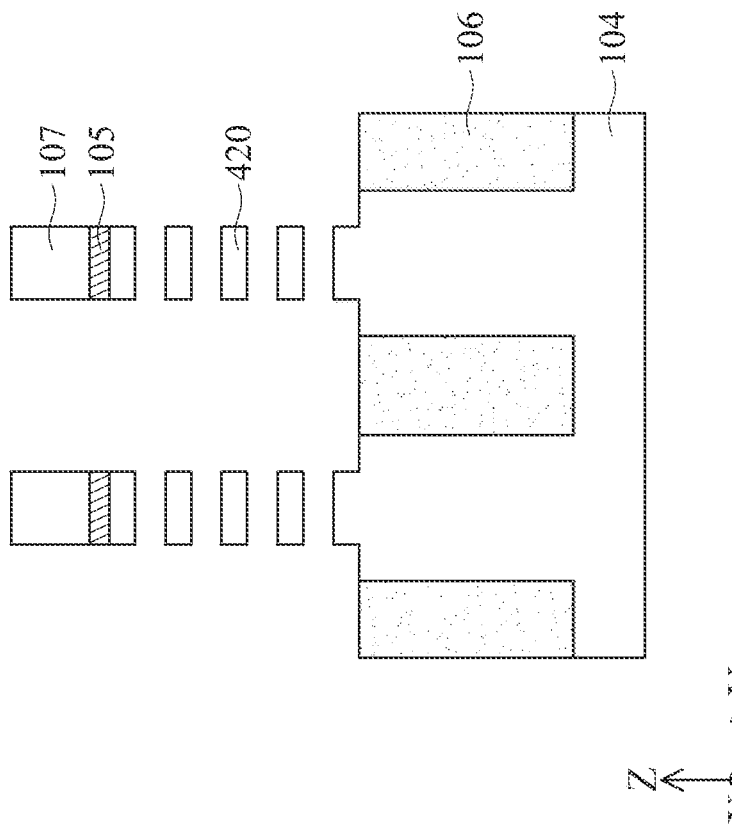
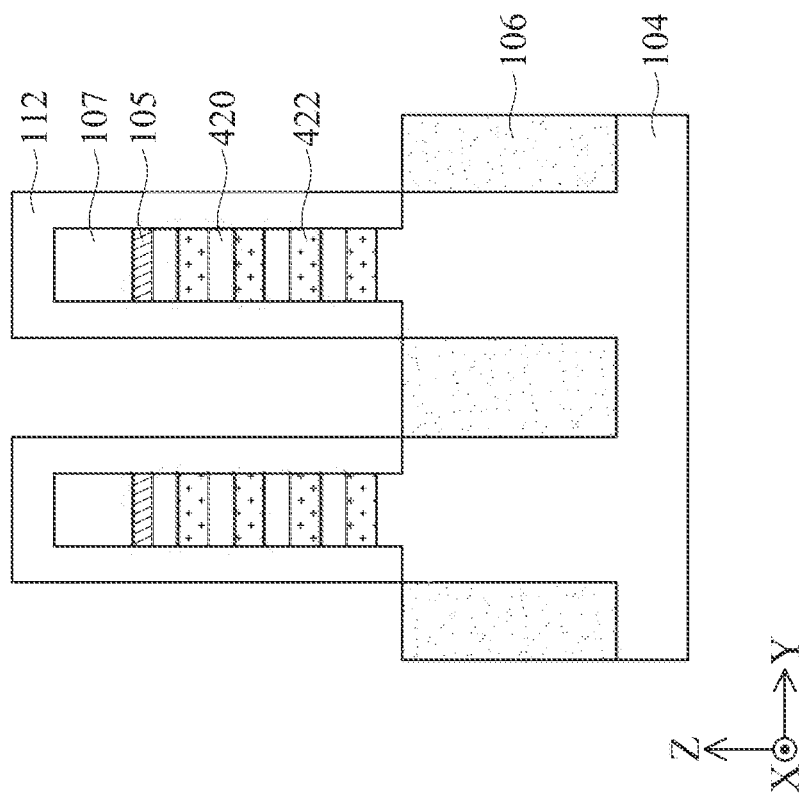
FIG. 31A
FIG. 31B

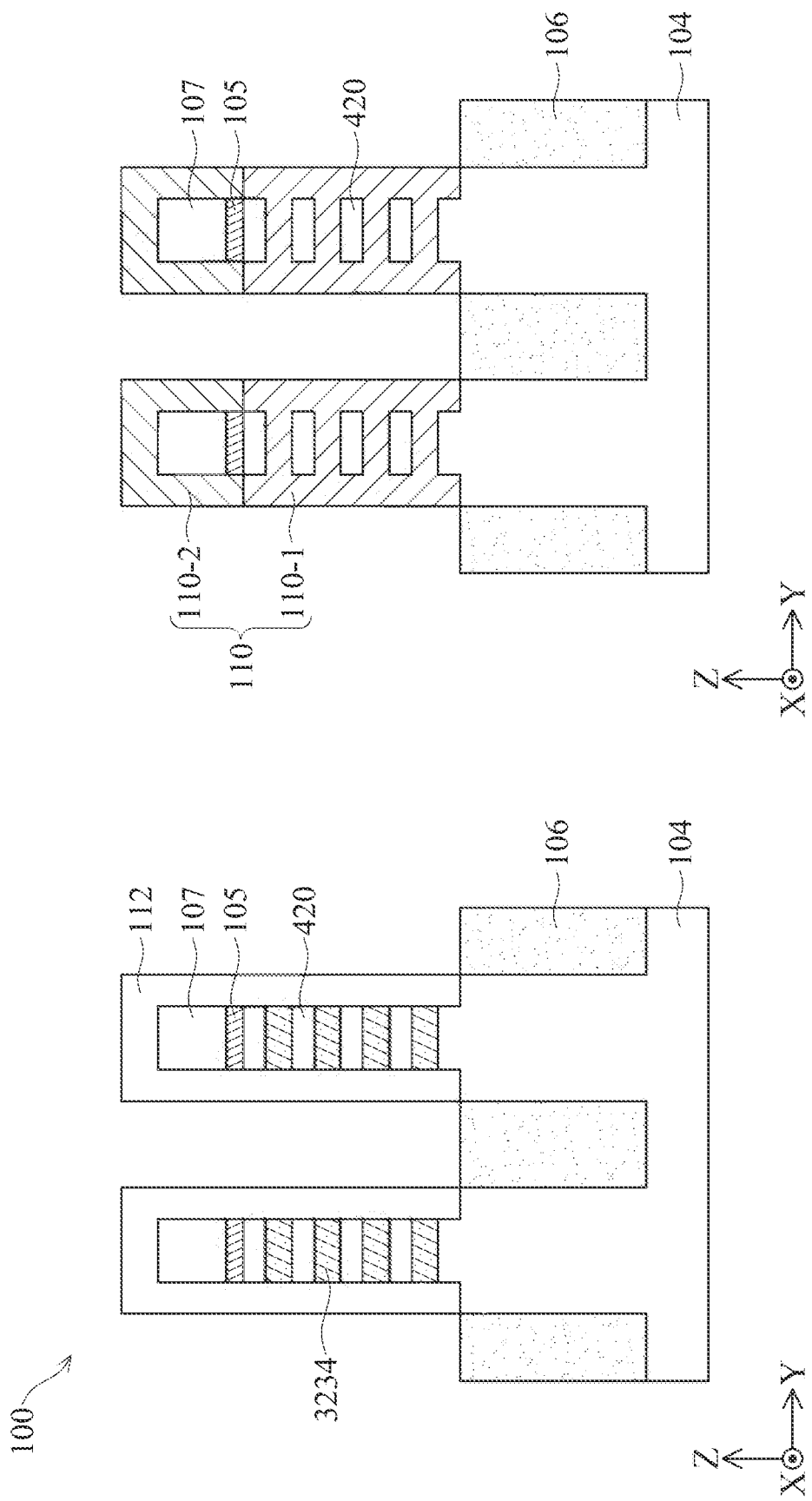

FACET-FREE EPITAXIAL STRUCTURES FOR SEMICONDUCTOR DEVICES

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of the present disclosure are best understood from the following detailed description when read with the accompanying figures.

FIGS. 24-33C illustrate cross-sectional views of another semiconductor device having facet-free epitaxial structures at various stages of its fabrication, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1:
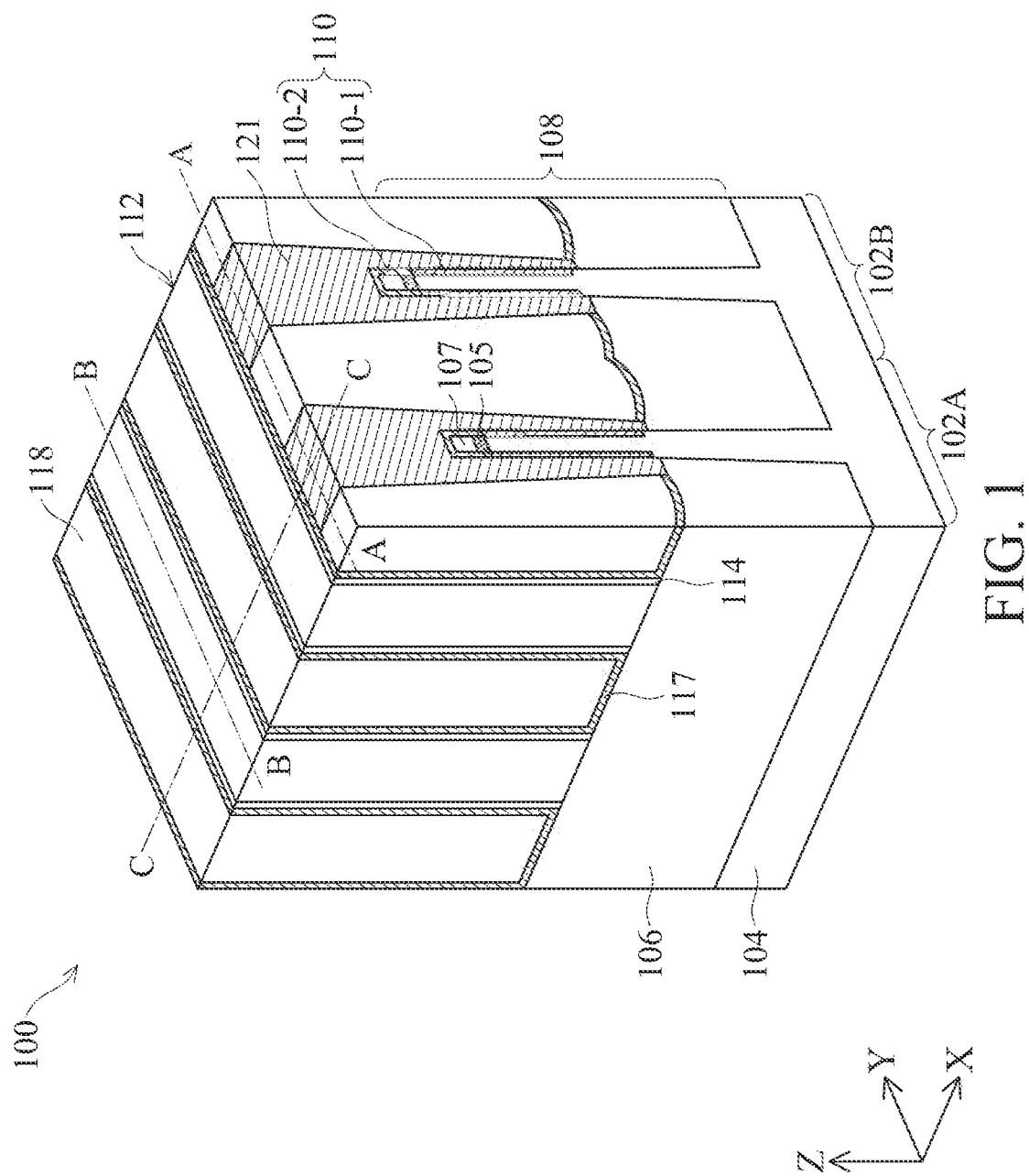
FIG. 1 illustrates an isometric view of a semiconductor device having facet-free epitaxial structures, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 20% of the value (e.g., ±1%, ±2%, ±3%, ±4%, 5%, ±10%, ±20% of the value). These values are merely examples and are not intended to be limiting. The terms "about" and "substantially" can refer to a percentage of the values as interpreted by those skilled in relevant art(s) in light of the teachings herein.

The scaling down of FET devices has introduced short-channel effects (SCEs), which can reduce off-state current and device performance of the FET devices. The profiles of source/drain (S/D) epitaxial structures on the FET devices can affect the SCEs, device performance, and process yield. S/D epitaxial structures with larger dimensions can reduce contact resistance between S/D epitaxial structures and contact structures and improve device performance. However, S/D epitaxial structures grown on fin structures can have various shapes, such as a diamond shape. S/D epitaxial structures may have different thicknesses around the fin structures. S/D epitaxial structures with larger dimensions may form epitaxial defects, such as bridging defects between adjacent S/D epitaxial structures. In addition, the contact structures may be in contact with the fin structures instead of the S/D epitaxial structures at the top of S/D epitaxial structures, which may increase contact resistance. These defects can degrade device performance and process yield.

Various embodiments in the present disclosure provide example methods for forming facet-free S/D epitaxial structures with a substantially uniform thickness in field effect transistors (FET) devices (e.g., finFETs, gate-all-around FETs, MOSFETs, etc.) and/or other semiconductor devices in an integrated circuit (IC). The example methods in the present disclosure can form a fin structure with a dielectric layer and an amorphous layer on the fin structure. A portion of the amorphous layer, a portion of the dielectric layer, and a portion of the fin structure can be removed to expose a top surface of a bottom portion of the fin structure. Facet-free S/D epitaxial structures with a substantially uniform thickness can be conformally formed (e.g., by a conformal deposition) on the amorphous layer, the dielectric layer, a top portion of the fin structure, and the top surface of the bottom portion of the fin structure. The top surface of the bottom portion can be wider than a bottom surface of the top portion. In some embodiments, the fin structure can include the same dopant type as adjacent fin structures. In some embodiments, the fin structure can include a dopant type different from adjacent fin structures. In some embodiments, the fin structure can include multiple semiconductor layers and the facet-free S/D epitaxial structures can be conformally formed on sidewall surfaces of the multiple semiconductor layers. In some embodiments, the fin structure can include multiple semiconductor layers and facet-free S/D epitaxial structures can be wrapped around the multiple semiconductor layers. With the control of the amorphous layer and the top and bottom portions of the fin structures, facet-free S/D epitaxial structures with a substantially uniform thickness can be formed to improve device performance and process yield. In some embodiments, semiconductor devices having facet-free S/D epitaxial structures with a substantially uniform thickness can improve process yield by about 2% to about 20% and improve device performance by about 2% to about 10%.

FIG. 1 illustrates an isometric view of a semiconductor device 100 having facet-free S/D epitaxial structures 110 with a substantially uniform thickness, in accordance with some embodiments. Semiconductor device can have finFETs 102A-102B. FIGS. 2-5 illustrate partial cross-sectional views along line A-A of semiconductor device 100 having facet-free epitaxial structures, in accordance with various embodiments.

Figure 2:
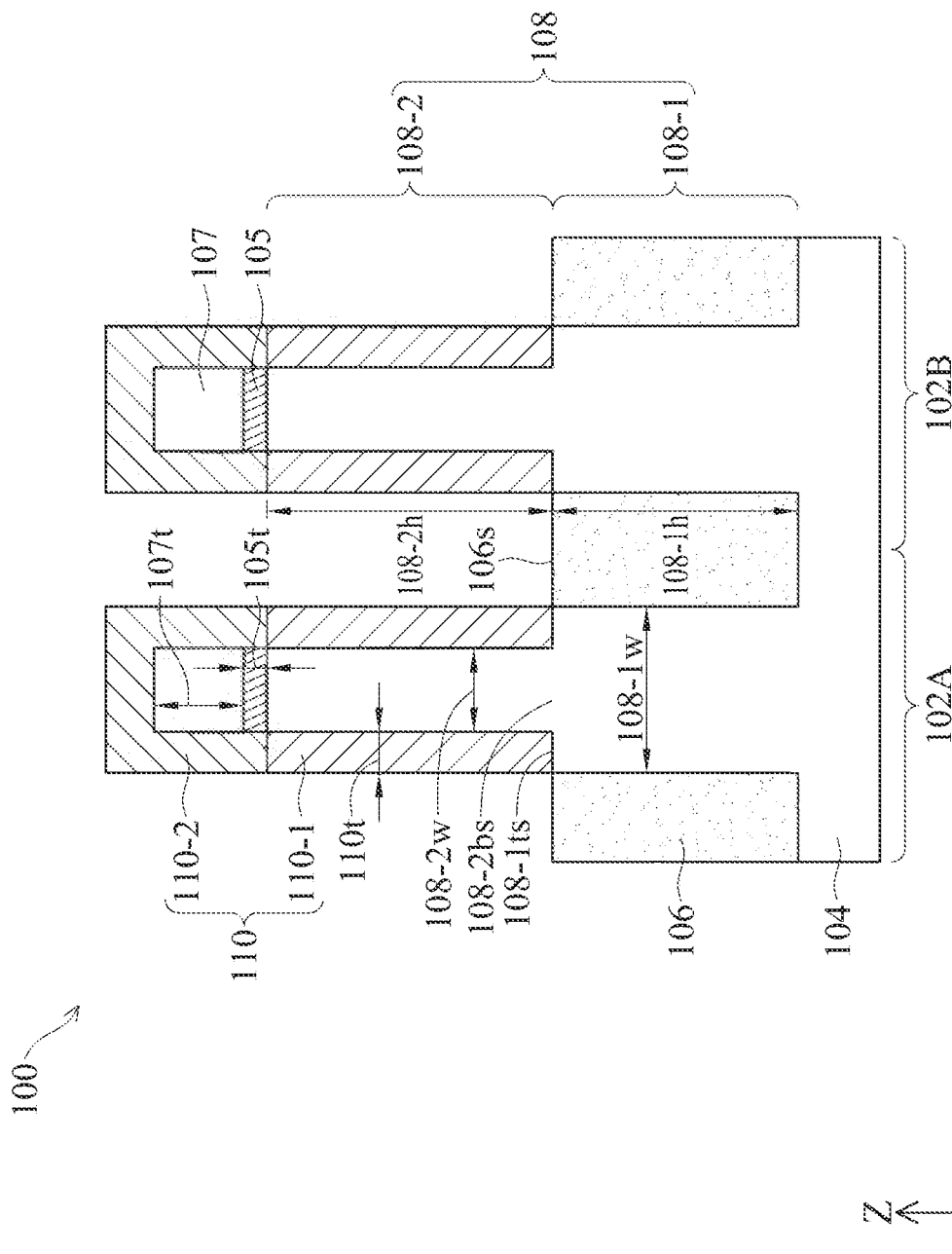
FIGS. 2-5 illustrate partial cross-sectional views of a semiconductor device having facet-free epitaxial structures, in accordance with some embodiments.
Figure 3:
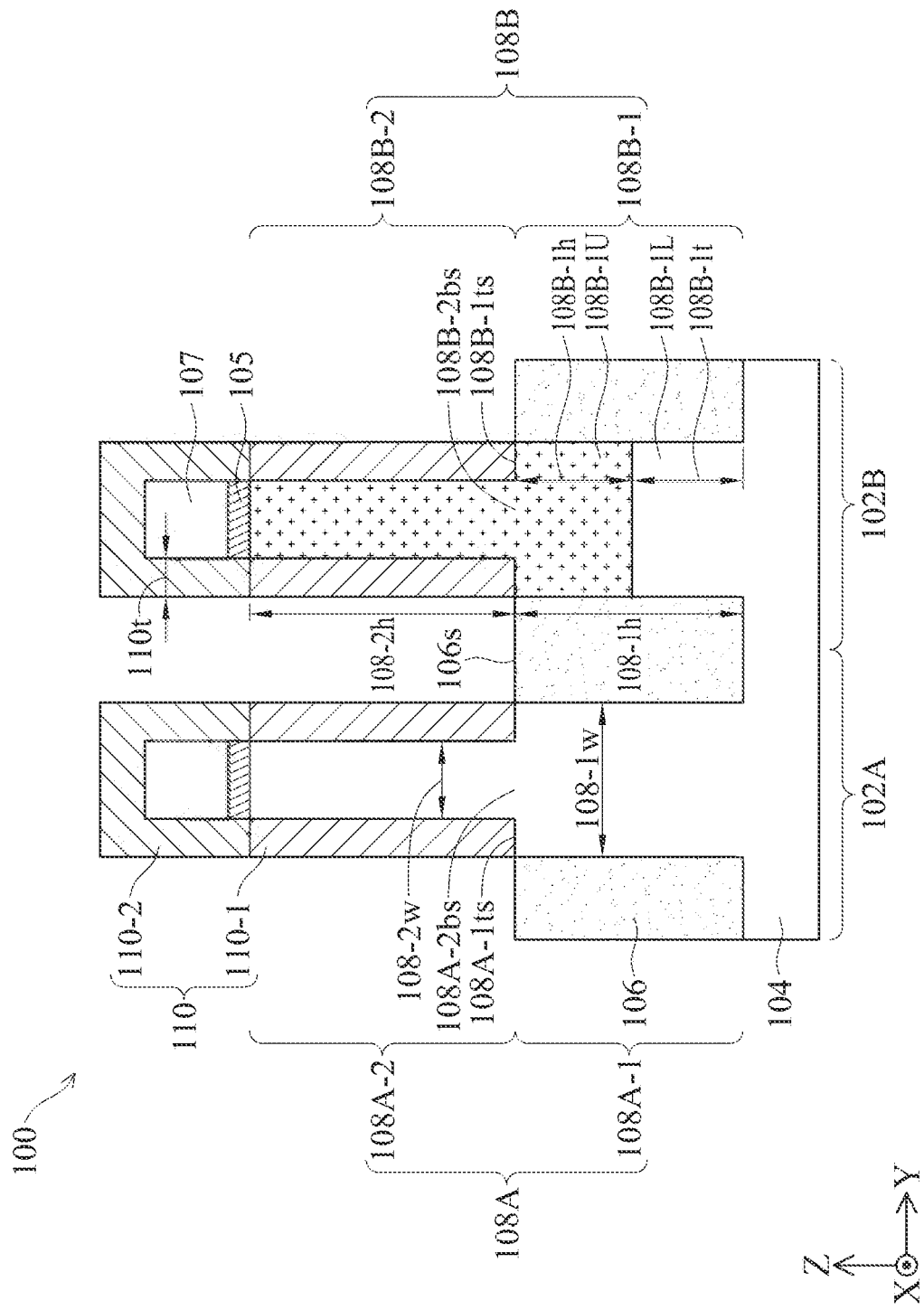
Figure 4:
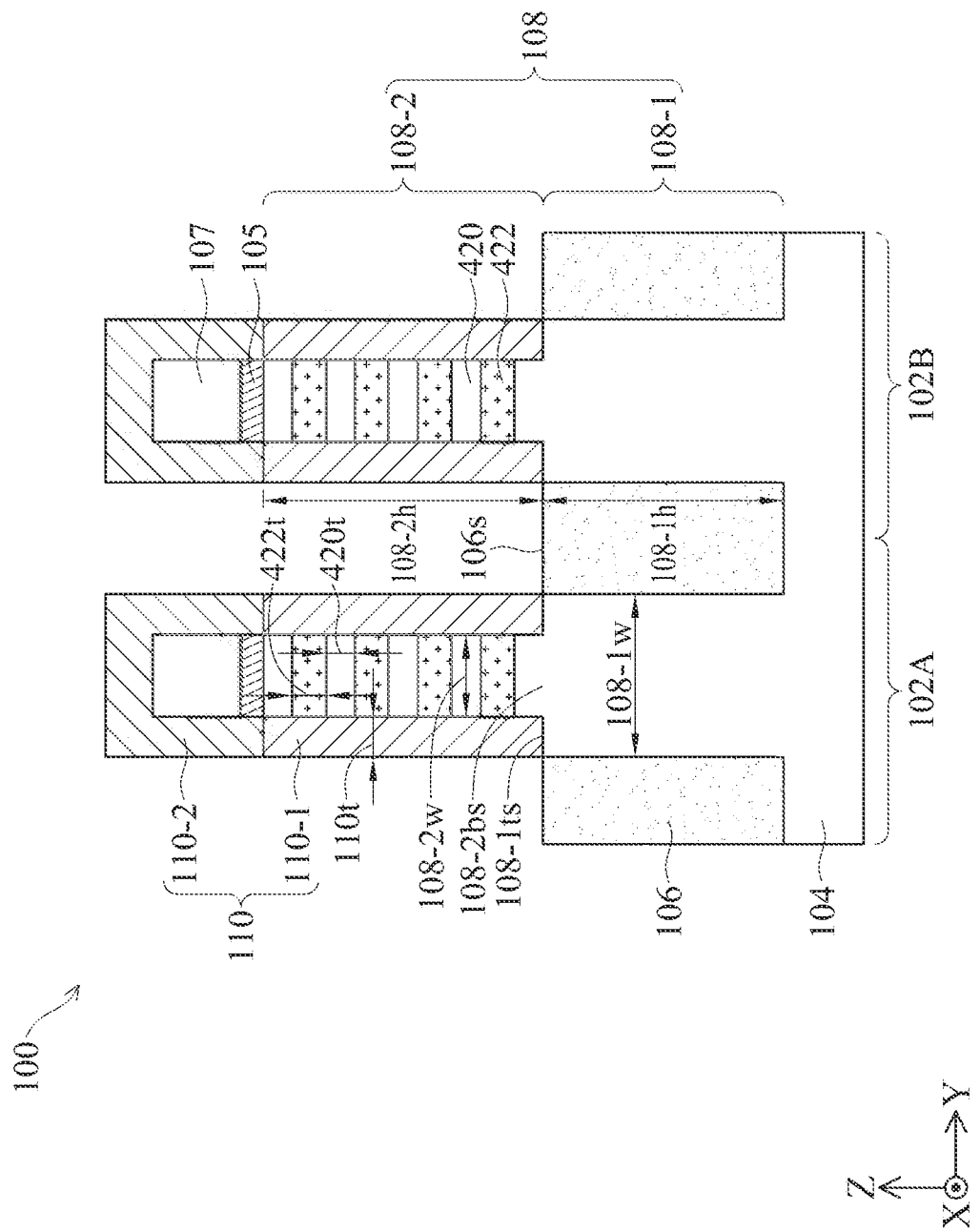
Figure 5:
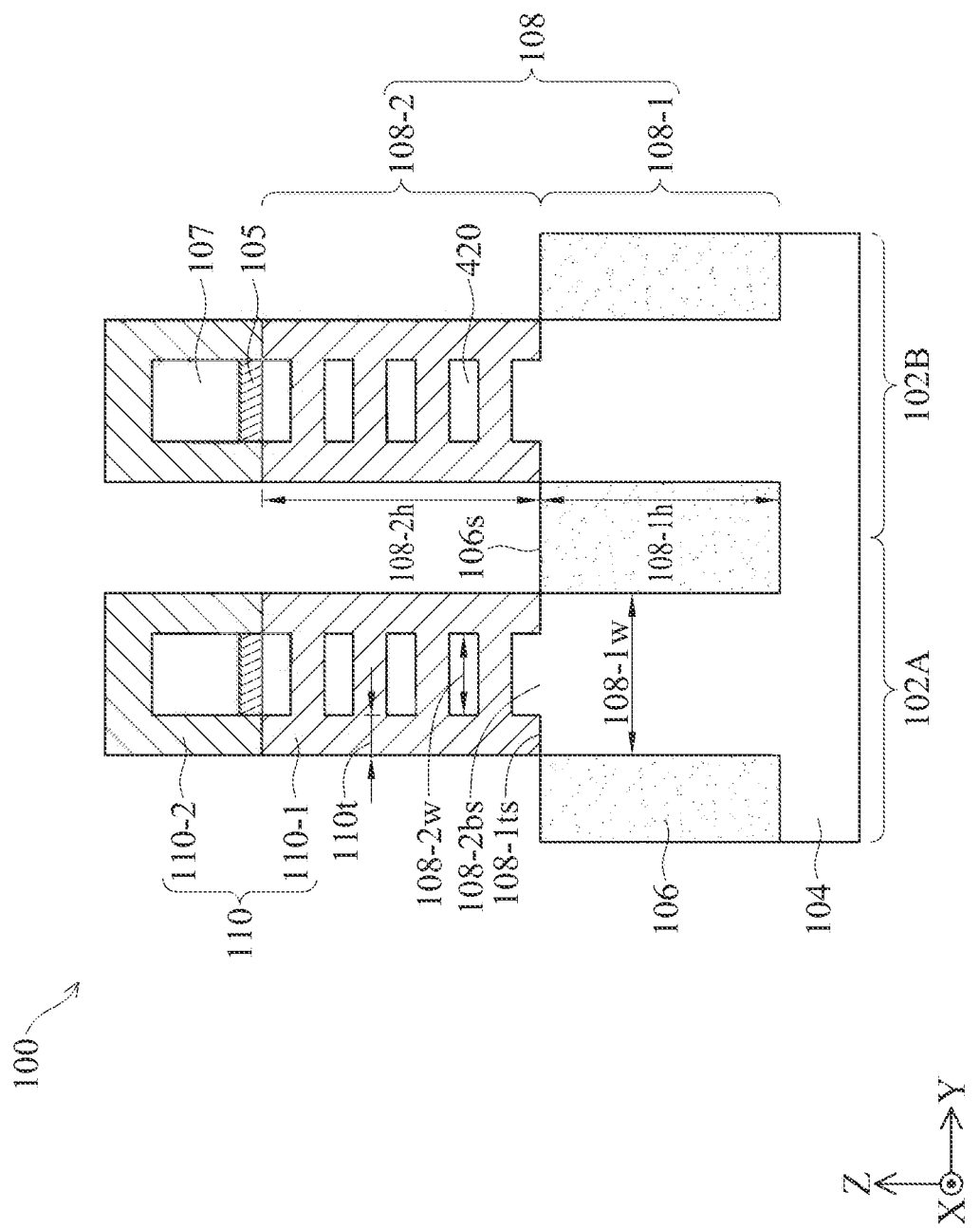

Referring to FIGS. 1-5, semiconductor device 100 having finFETs 102A-102B can be formed on a substrate 104 and can include fin structures 108, shallow trench isolation (STI) regions 106, S/D epitaxial structures 110, gate structures 112, gate spacers 114, etch stop layer (ESL) 117, interlayer dielectric (ILD) layer 118, and S/D contact structures 121. In some embodiments, as shown in FIG. 2, finFETs 102A-102B can be both NFETs. In some embodiments, as shown in FIG. 3, finFET 102A can be n-type finFETs (NFET) and have n-type fin structures 108A. FinFET 102B can be p-type finFETs (PFET) and have p-type fin structures 108B. In some embodiments, finFETs 102A-102B can be both PFETs (not shown). In some embodiments, as shown in FIG. 4, finFETs 102A-102B can include fin structures 108 having first and second semiconductor layers 420 and 422 and S/D epitaxial structures 110 on first and second semiconductor layers 420 and 422. In some embodiments, as shown in FIG. 5, finFETs 102A-102B can include fin structures 108 having first semiconductor layers 420 and S/D epitaxial structures 110 wrapped around first semiconductor layers 420.

Though FIGS. 1-5 shows two finFETs, semiconductor device 100 can have any number of finFETs. Though FIGS. 4-5 shown four sets of first and second semiconductor layers 420 and 422, semiconductor device 100 can have any number of first and second semiconductor layers 420 and 422. In addition, semiconductor device 100 can be incorporated into an integrated circuit (IC) through the use of other structural components, such as S/D contact structures, gate contacts, conductive vias, conductive lines, dielectric layers, passivation layers, interconnects, etc., which are not shown for simplicity. ESL 117, ILD layer 118, and S/D contact structures 121 in FIGS. 2-5 are not shown for simplicity. The discussion of elements of finFETs 102A-102B with the same annotations applies to each other, unless mentioned otherwise. And like reference numerals generally indicate identical, functionally similar, and/or structurally similar elements.

Referring to FIGS. 1-5, substrate 104 can include a semiconductor material, such as silicon. In some embodiments, substrate 104 includes a crystalline silicon substrate (e.g., wafer). In some embodiments, substrate 104 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 104 can be doped depending on design requirements (e.g., p-type substrate or n-type substrate). In some embodiments, substrate 104 can be doped with p-type dopants (e.g., boron, indium, aluminum, or gallium) or n-type dopants (e.g., phosphorus or arsenic).

Referring to FIGS. 1-3, fin structures 108 can be formed from patterned portions of substrate 104. Embodiments of the fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, forming patterns that have, for example, pitches smaller than what is otherwise obtainable using a single, direct photolithography process. For example, a sacrificial layer is formed over a substrate and patterned using a photolithography process. Spacers can be formed alongside the patterned sacrificial layer using a self-aligned process. The sacrificial layer is then removed, and the remaining spacers can then be used to pattern the fin structures.

As shown in FIGS. 1-3, fin structures 108 can be disposed under S/D epitaxial structures 110 and gate structures 112 and can extend along an X-axis through gate structures 112. Referring to FIG. 2, fin structures 108 can include fin bottom portions 108-1 and fin top portions 108-2. Fin bottom portions 108-1 can have a top surface 108-1$ts$ wider than a bottom surface 108-2$bs$ of fin top portions 108-2. In some embodiments, fin bottom portions 108-1 can have a horizontal dimension 108-1$w$ (e.g., width) along a Y-axis ranging from about 5 nm to about 50 nm. Fin top portions 108-2 can have a horizontal dimension 108-2$w$ (e.g., width) along a Y-axis ranging from about 1 nm to about 10 nm. In some embodiments, horizontal dimension 108-2$w$ can be less than horizontal dimension 108-1$w$ and a ratio between horizontal dimension 108-2$w$ to horizontal dimension 108-1$w$ can range from about 0.1 to about 0.9. If the ratio is less than about 0.1, adjacent fin structures may contact one another, causing an electrical short. If the ratio is greater than about 0.9, S/D epitaxial structures 110 may have a smaller volume, increasing contact resistance between S/D epitaxial structures 110 and S/D contact structures. With horizontal dimension 108-2$w$ less than horizontal dimension 108-1$w$, facet-free S/D epitaxial structures 110 can be conformally formed on top surface 108-1$ts$ of fin bottom portion 108-2. In some embodiments, fin bottom portions 108-1 can have a vertical dimension 108-1h (e.g., height) along a Z-axis ranging from about 10 nm to about 50 nm. Fin top portions 108-2 can have a vertical dimension 108-2h (e.g., height) along a Z-axis ranging from about 50 nm to about 100 nm. In some embodiments, vertical dimension 108-2h can be referred to as "fin height" above STI regions 106.

Referring to FIG. 3, fin structure 108A of finFET 102A can include a fin bottom portion 108A-1 and a fin top portion 108A-2. Fin structure 108B of finFET 102B can include a fin bottom portion 108B-1 and a fin top portion 108B-2. Fin bottom portions 108A-1 and 108B-1 can be collectively referred to as "fin bottom portions 108-1." Fin top portions 108A-2 and 108B-2 can be collectively referred to as "fin top portions 108-2." In some embodiments, fin structure 108B can include a semiconductor material different from fin structure 108A. For example, fin structure 108A can include silicon and fin structure 108B can include silicon germanium. Fin bottom portions 108-1 can have top surfaces 108A-1ts and 108B-1ts wider than bottom surfaces 108A-2bs and 108B-2bs of fin top portions 108-2. In some embodiments, fin bottom portions 108-1 can have horizontal dimension 108-1w along a Y-axis and fin top portions 108-2 can have horizontal dimension 108-2w along a Y-axis. In some embodiments, fin bottom portions 108-1 can have vertical dimension 108-1h along a Z-axis and fin top portions 108-2 can have vertical dimension 108-2h along a Z-axis. In some embodiments, fin bottom portion 108B-1 can include a first region 108B-1L and a second region 108B-1U. First region 108B-1L can have a vertical dimension 108B-1h (e.g., height) along a Z-axis ranging from about 10 nm to about 20 nm. Second region 108B-1U can have a vertical dimension 108B-1h (e.g., height) along a Z-axis ranging from about 10 nm to about 30 nm. First region 108B-1L can include a semiconductor material the same as substrate 104 and second region 108B-1U can include a semiconductor material the same as fin top portion 108B-2. For example, first region 108B-1L and substrate 104 can include silicon and second region 108B-1U and fin top portion 108B-2 can include silicon germanium. Second region 108B-1U and fin top portion 108B-2 can provide growth seed layers for S/D epitaxial structures 110.

Referring to FIG. 4, fin structures 108 can include fin bottom portions 108-1 and fin top portions 108-2. Fin bottom portions 108-1 can have a top surface 108-1ts wider than a bottom surface 108-2bs of fin top portions 108-2. In some embodiments, fin bottom portions 108-1 and fin top portions 108-2 in FIG. 4 can have dimensions similar to fin bottom portions 108-1 and fin top portions 108-2 in FIG. 2. Fin top portions 108-2 can include first semiconductor layers 420 and second semiconductor layers 422 stacked in an alternating configuration. In some embodiments, first and second semiconductor layers 420 and 422 can have respective vertical dimensions 420t and 422t (e.g., thickness) along a Z-axis ranging from about 3 nm to about 15 nm. In some embodiments, first and second semiconductor layers 420 and 422 can include different semiconductor materials. For example, first semiconductor layers 420 can include a semiconductor material the same as fin bottom portions 108-1, such as silicon. Second semiconductor layers 422 can include a semiconductor material different fin bottom portions 108-1, such as silicon germanium.

Referring to FIG. 5, fin structures 108 can include fin bottom portions 108-1 and fin top portions 108-2. Fin bottom portions 108-1 can have a top surface 108-1ts wider than a bottom surface 108-2bs of fin top portions 108-2. Fin top portions 108-2 can include first semiconductor layers 420. In some embodiments, fin bottom portions 108-1 and fin top portions 108-2 in FIG. 5 can have dimensions similar to fin bottom portions 108-1 and fin top portions 108-2 in FIG. 4. First semiconductor layers 420 in FIG. 5 can have dimensions similar to and include materials similar to first semiconductor layers 420 in FIG. 4.

In FIGS. 1-5, fin structures 108 under gate structures 112 can form channel regions of semiconductor device 100 and represent current carrying structures of semiconductor device 100. In some embodiments, S/D epitaxial structures 110 can be formed on fin structures 108 outside of gate structures 112.

Referring to FIGS. 1-5, STI regions 106 can provide electrical isolation to fin structures 108 from adjacent fin structures and to semiconductor device 100 from neighboring structures integrated with or deposited onto substrate 104. STI regions 106 can have a dielectric material, such as silicon oxide, silicon nitride, silicon oxynitride, fluorine-doped silicate glass (FSG), a low-k dielectric material, and other suitable insulating materials. In some embodiments, STI regions 106 can include a multi-layered structure.

Referring to FIG. 1, gate structures 112 can be disposed on fin structures 108 over substrate 104. In some embodiments, gate structures 112 can be formed by a blanket deposition of amorphous silicon or polysilicon, followed by photolithography and etching of the deposited amorphous silicon or polysilicon. The deposited amorphous silicon or polysilicon can be replaced by conductive materials to form gate structures 112 in subsequent processes. In some embodiments, gate structures 112 can include titanium, tantalum, titanium nitride, tantalum nitride, aluminum, cobalt, tungsten, nickel, ruthenium, and other suitable conductive materials. Gate spacers 114 can be disposed on sidewalls of gate structures 112. Gate spacers 114 can include insulating material, such as silicon oxide, silicon nitride, a low-k material, and a combination thereof. Gate spacers 114 can have a low-k material with a dielectric constant less than about 3.9. In some embodiments, gate spacers 114 can protect gate structures 112 during subsequent processing steps (e.g., during the formation of S/D epitaxial structures 110).

Referring to FIGS. 1-5, dielectric layer 105 can be disposed on fin structures 108. In some embodiments, dielectric layer 105 can include a blanket layer of dielectric material, such as silicon oxide ($SiO_x$), silicon nitride ($SiN_x$), silicon oxynitride (SiON), silicon carbonitride (SiCN), silicon oxycarbide (SiOC), silicon oxycarbonitride (SiOCN), and a combination thereof. In some embodiments, dielectric layer 105 can have a vertical dimension 105t (e.g., thickness) along a Z-axis ranging from about 0.5 nm to about 3 nm. Dielectric layer 105 can promote formation of amorphous layer 107. If vertical dimension 105t is less than about 0.5 nm, amorphous layer 107 may not form on fin structures 108. If vertical dimension 105t is greater than about 3 nm, S/D epitaxial structures 110 may not be facet-free and may not have a substantially uniform thickness.

Amorphous layer 107 can be disposed on dielectric layer 105. In some embodiments, amorphous layer 107 can include an amorphous layer of semiconductor material, such as amorphous silicon, amorphous silicon germanium, and other suitable amorphous semiconductor materials. In some embodiments, amorphous layer 107 can have a vertical dimension 107t (e.g., thickness) along a Z-axis ranging from about 3 nm to about 20 nm. Amorphous layer 107 can prevent damage of fin structures 108 during the formation of fin structures 108 and promote formation of facet-free S/D epitaxial structures 110 with a substantially uniform thickness. If vertical dimension 107t is less than about 3 nm, fin structures 108 may be over etched during formation of fin structures 108. If vertical dimension 107*t* is greater than about 20 nm, S/D contact structure may not fully cover S/D epitaxial structures 110, increasing contact resistance.

Referring to FIGS. 1-2, S/D epitaxial structures 110 can be disposed on a top surface of amorphous layer 107, sidewall surfaces of amorphous layer 107, dielectric layer 105, and fin top portions 108-2, and top surface 108-1*ts* of fin bottom portions 108-1. Referring to FIG. 3, S/D epitaxial structures 110 can be disposed on sidewall surfaces of fin top portions 108A-2 and 108B-2. Referring to FIG. 4, S/D epitaxial structures 110 can be disposed on sidewall surfaces of first and second semiconductor layers 420 and 422 in fin top portions 108-2. Referring to FIG. 5, SID epitaxial structures 110 can be wrapped around first semiconductor layers 420 in fin top portions 108-2.

S/D epitaxial structures 110 can be disposed on opposing sides of gate structures 112 and function as S/D regions of semiconductor device 100. In some embodiments, S/D epitaxial structures 110 can include an epitaxially-grown semiconductor material the same as the material of substrate 104. In some embodiments, the epitaxially-grown semiconductor material can include a material different from the material of substrate 104 and imparts a strain on the channel regions under gate structures 112. Since the lattice constant of such epitaxially-grown semiconductor material is different from the material of substrate 104, the channel regions are strained to advantageously increase carrier mobility in the channel regions of semiconductor device 100. The epitaxially-grown semiconductor material can include: (i) a semiconductor material, such as germanium and silicon; (ii) a compound semiconductor material, such as gallium arsenide and aluminum gallium arsenide; or (iii) a semiconductor alloy, such as silicon germanium and gallium arsenide phosphide.

Referring to FIGS. 1-4, S/D epitaxial structures 110 can include (i) a first epitaxial portion 110-1 on sidewall surfaces of fin top portions 108-2 and (ii) a second epitaxial portion 110-2 on the top surface of amorphous layer 107, the sidewall surfaces of amorphous layer 107, and dielectric layer 105. In some embodiments, first epitaxial portion 110-1 can include a crystalline semiconductor material. Second epitaxial portion 110-2 can include an amorphous semiconductor material or multi-crystalline semiconductor material. In some embodiments, first epitaxial portion 110-1 and second epitaxial portion 110-2 can include the same semiconductor material with different crystallinity. In some embodiments, first epitaxial portion 110-1 and second epitaxial portion 110-2 can facet-free and have a substantially uniform thickness. In some embodiments, first epitaxial portion 110-1 and second epitaxial portion 110-2 of S/D epitaxial structures 110 can have a thickness 110*t* ranging from about 2 nm to about 20 nm. A ratio of thickness 110*t* to horizontal dimension 108-1*w* can range from about 0.05 to about 0.5. If thickness 110*t* is less than about 2 nm or the ratio is less than about 0.05, S/D epitaxial structures 110 may not be facet-free and may not have a uniform thickness. If thickness 110*t* is greater than about 20 nm or the ratio is greater than about 0.5, adjacent fin structures may contact one another, causing an electrical short.

Referring to FIG. 5, S/D epitaxial structures 110 can include (i) a first epitaxial portion 110-1 wrapped around first semiconductor layers 420 of fin top portions 108-2 and (ii) a second epitaxial portion 110-2 on the top surface of amorphous layer 107, the sidewall surfaces of amorphous layer 107, and dielectric layer 105. In some embodiments, first epitaxial portion 110-1 can include a crystalline semiconductor material similar to first epitaxial portion 110-1 in FIG. 2. Second epitaxial portion 110-2 can include an amorphous semiconductor material or multi-crystalline semiconductor material similar to second epitaxial portion 110-2 in FIG. 2. In some embodiments, first epitaxial portion 110-1 and second epitaxial portion 110-2 can include the same semiconductor material with different crystallinity. In some embodiments, first epitaxial portion 110-1 and second epitaxial portion 110-2 can be facet-free and can have a substantially uniform thickness. In some embodiments, first epitaxial portion 110-1 and second epitaxial portion 110-2 of S/D epitaxial structures 110 can have a thickness 110*t* ranging from about 2 nm to about 20 nm.

In some embodiments, with the control of amorphous layer 107 and the top and bottom portions of fin structures 108, facet-free S/D epitaxial structures 110 can be conformally formed to improve device performance and process yield of semiconductor device 100. In some embodiments, semiconductor device 100 having facet-free SID epitaxial structures 110 with a substantially uniform thickness can improve process yield by about 2% to about 20% and improve device performance by about 2% to about 10%.

In some embodiments, S/D epitaxial structures 110 can include Si and can be in-situ doped during an epitaxial growth process using n-type dopants, such as phosphorus (P) and arsenic (As). For example, S/D epitaxial structures 110 on fin structures 108 in FIGS. 1, 2, 4, and 5 and S/D epitaxial structures 110 on fin structure 108A in FIG. 3 can be n-type. For n-type in-situ doping, n-type doping precursors, such as phosphine ($PH_3$), arsine ($AsH_3$), and other n-type doping precursors, can be used. In some embodiments, S/D epitaxial structures can include Si, SiGe, Ge or III-V materials (e.g., indium antimonide (InSb), gallium antimonide (GaSb), or indium gallium antimonide (InGaSb)) and can be in-situ doped during an epitaxial growth process using p-type dopants, such as boron, indium, and gallium. For example, S/D epitaxial structures 110 on fin structures 108 in FIGS. 1, 2, 4, and 5 and S/D epitaxial structures 110 on fin structure 108B in FIG. 3 can be p-type. For p-type in-situ doping, p-type doping precursors, such as diborane ($B_2H_6$), boron trifluoride ($BF_3$), and other p-type doping precursors, can be used. In some embodiments, S/D epitaxial structures 110 can include one or more epitaxial layers and each epitaxial layer can have different compositions.

Referring to FIG. 1, ESL 117 can be disposed on STI regions 106 and sides of gate spacers 114. ESL 117 can be configured to protect STI regions 106 and gate structures 112 during the formation of S/D contact structures 121 on S/D epitaxial structures 110. In some embodiments, ESL 117 can include, for example, $SiN_x$, $SiO_x$, SiON, silicon carbide (SiC), SiCN, boron nitride (BN), silicon boron nitride (SiBN), silicon carbon boron nitride (SiCBN), or a combination thereof. ILD layer 118 can be disposed on ESL 117 over S/D epitaxial structures 110 and STI regions 106. ILD layer 118 can include a dielectric material deposited using a deposition method suitable for flowable dielectric materials. For example, flowable silicon oxide can be deposited using flowable chemical vapor deposition (FCVD). In some embodiments, the dielectric material can include silicon oxide. S/D contact structures 121 can be formed in ILD layer 118 and can be disposed on S/D epitaxial structures 110. In some embodiments, S/D contact structures 121 can include a metal silicide layer and a metal contact. In some embodiments, SID contact structures 121 can include titanium, tantalum, titanium nitride, tantalum nitride, aluminum, cobalt, tungsten, nickel, ruthenium, and other suitable conductive materials.

Figure 6:
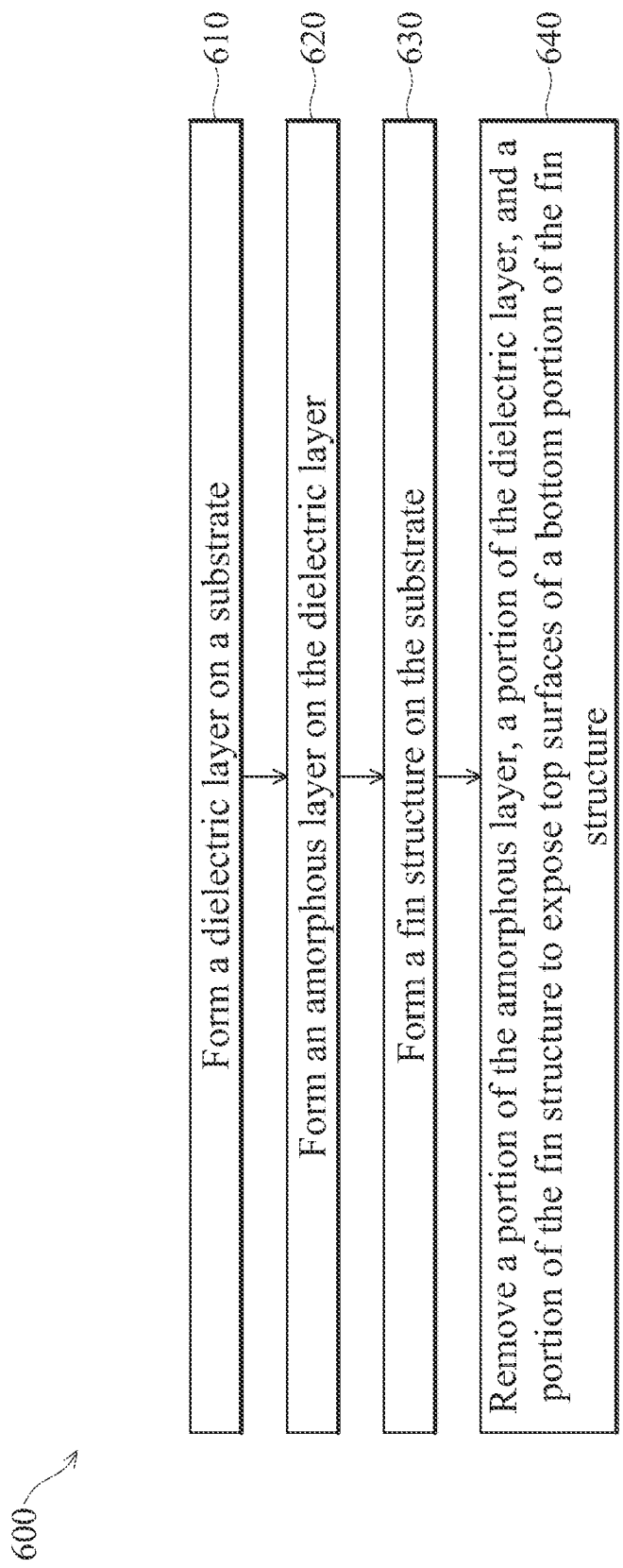
FIG. 6 is a flow diagram of a method for fabricating a semiconductor device having facet-free epitaxial structures, in accordance with some embodiments.

FIG. 6 is a flow diagram of a method 600 for fabricating semiconductor device 100 having facet-free S/D epitaxial structures 110 with a substantially uniform thickness, in accordance with some embodiments. Method 600 may not be limited to finFET devices and can be applicable to devices that would benefit from facet-free S/D epitaxial structures, such as planar FETs, finFETs, GAA FETs, and other semiconductor devices. Additional fabrication operations may be performed between various operations of method 600 and may be omitted merely for clarity and ease of description. Additional processes can be provided before, during, and/or after method 600; one or more of these additional processes are briefly described herein. Moreover, not all operations may be needed to perform the disclosure provided herein. Additionally, some of the operations may be performed simultaneously or in a different order than shown in FIG. 6. In some embodiments, one or more other operations may be performed in addition to or in place of the presently described operations.

For illustrative purposes, the operations illustrated in FIG. 6 will be described with reference to the example fabrication process for fabricating semiconductor device 100 as illustrated in FIGS. 7-12. FIGS. 7-12 illustrate cross-sectional views of semiconductor device 100 having facet-free S/D epitaxial structures 110 at various stages of its fabrication, in accordance with some embodiments. Elements in FIGS. 7-12 with the same annotations as elements in FIGS. 1 and 2 are described above.

Figure 7:
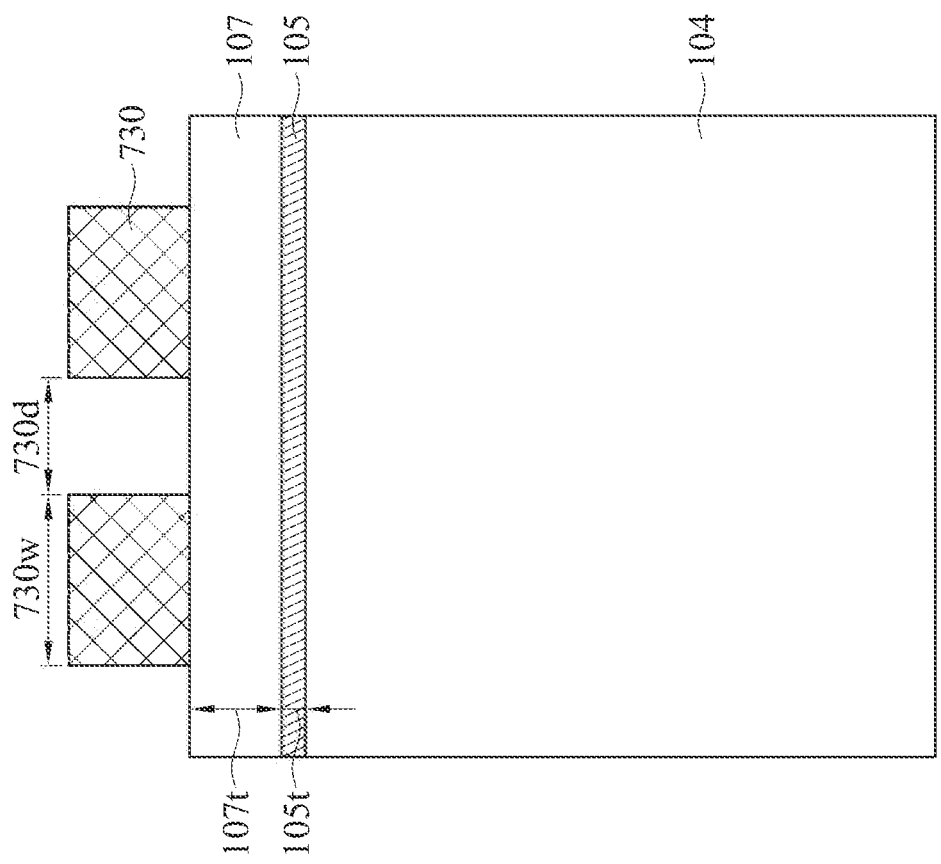
FIGS. 7-12 illustrate cross-sectional views of a semiconductor device having facet-free epitaxial structures at various stages of its fabrication, in accordance with some embodiments.

In referring to FIG. 6, method 600 begins with operation 610 and the process of forming a dielectric layer on a substrate. For example, as shown in FIG. 7, dielectric layer 105 can be formed on substrate 104. In some embodiments, dielectric layer 105 can be blanket deposited on substrate 104 by chemical vapor deposition (CVD), physical vapor deposition (PVD), atomic layer deposition (ALD), thermal oxidation, and other suitable methods. For example, dielectric layer 105 can include silicon oxide formed by thermal oxidation or standard clean processes. In some embodiments, dielectric layer 105 can include dielectric materials such as $SiO_x$, $SiN_x$, SiON, SiCN, SiOC, SiOCN, and a combination thereof. In some embodiments, dielectric layer 105 can have vertical dimension 105t (e.g., thickness) along a Z-axis ranging from about 0.5 nm to about 3 nm. Dielectric layer 105 can promote formation of an amorphous layer instead of a crystalline epitaxial layer on substrate 104.

Referring to FIG. 6, in operation 620, an amorphous layer can be formed on the dielectric layer. For example, as shown in FIG. 7, amorphous layer 107 can be blanket deposited on dielectric layer 105. In some embodiments, amorphous layer 107 can include a layer of amorphous semiconductor material, such as amorphous silicon, amorphous silicon germanium, and other suitable amorphous semiconductor materials. Amorphous layer 107 can be blanket deposited by CVD, PVD, or other suitable deposition methods. The semiconductor materials deposited on dielectric layer 105 can be amorphous and form amorphous layer 107. In some embodiments, amorphous layer 107 can have vertical dimension 107t (e.g., thickness) along a Z-axis ranging from about 3 nm to about 20 nm. Amorphous layer 107 can prevent damage of fin structures during the formation of the fin structures and promote formation of facet-free S/D epitaxial structures with a substantially uniform thickness.

The formation of amorphous layer 107 can be followed by the formation of patterned hard mask layer 730, as shown in FIG. 7. In some embodiments, hard mask layer 730 can include a stack of layers including dielectric layers and photoresist. In some embodiments, hard mask layer 730 can include $SiO_x$, $SiN_x$, and other suitable dielectric materials deposited by CVD, PVD, and other suitable deposition methods. As shown in FIG. 7, hard mask layer 730 can be patterned to have a horizontal dimension 730w (e.g., width) along a Y-axis direction ranging from about 5 nm to about 50 nm. Adjacent hard mask layer 730 can have a horizontal dimension 730d (e.g., distance) along a Y-axis direction ranging from about 10 nm to about 100 nm. Hard mask layer 730 can be patterned to subsequently form fin structures 108. In some embodiments, the Y-axis can be along a (110) direction of substrate 104 and the Z-axis can be along a (001) direction of substrate 104.

Figure 8:
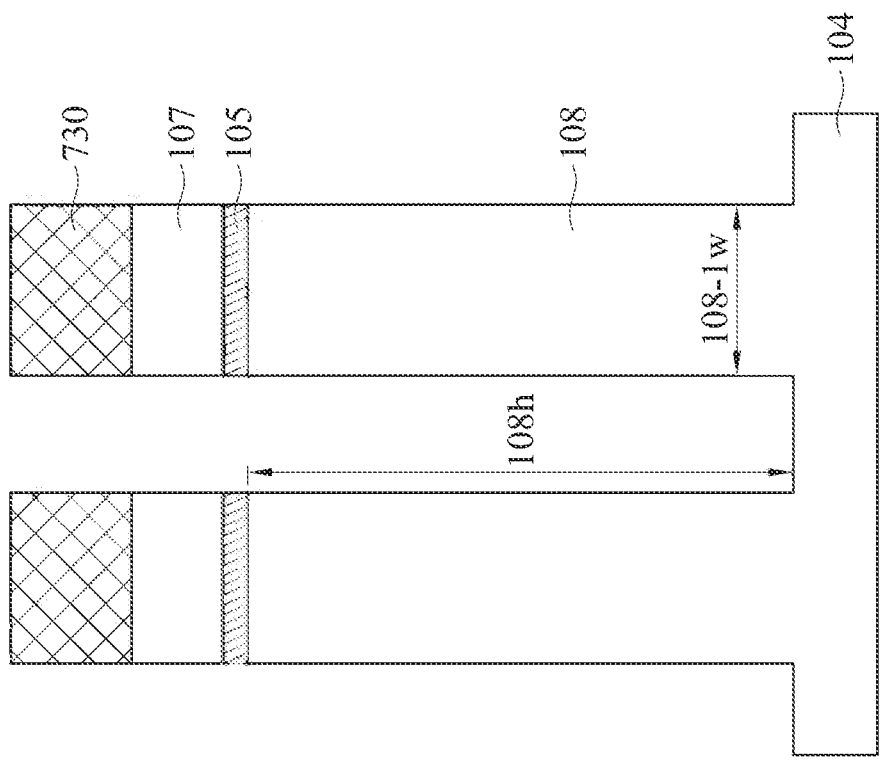
Figure 9:
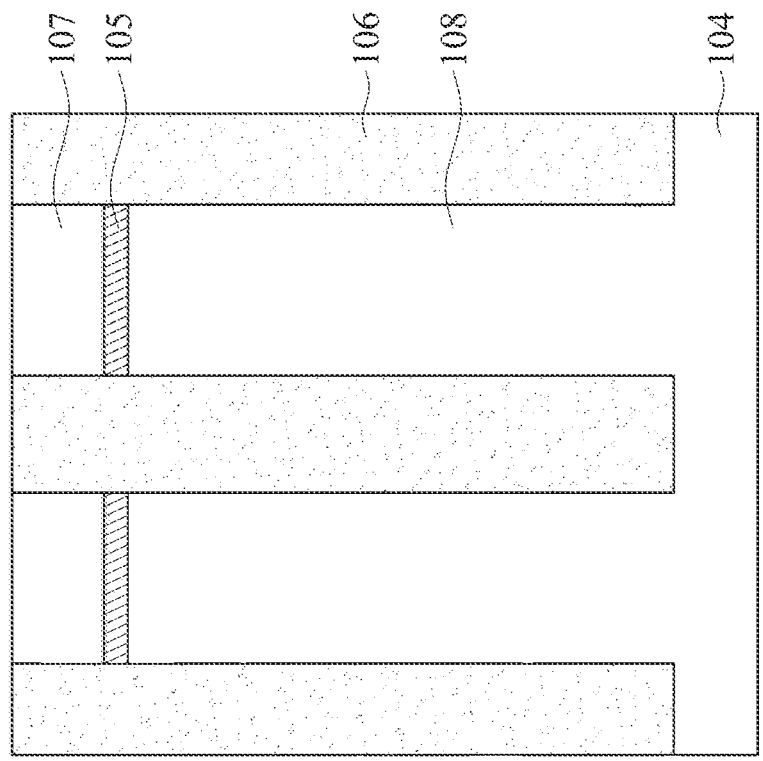

Referring to FIG. 6, in operation 630, a fin structure can be formed on the substrate. For example, as shown in FIGS. 8 and 9, fin structures 108 can be formed on substrate 104. The formation of fin structures 108 can include a first anisotropic etch. During the first anisotropic etch, amorphous layer 107, dielectric layer 105, and substrate 104 can be etched anisotropically to form fin structures 108, as shown in FIG. 8. In some embodiments, the first anisotropic etch can be non-selective and can form vertical sidewalls for fin structures 108.

In some embodiments, the first anisotropic etch can be a biased plasma etch or other suitable etching method. In some embodiments, the biased plasma etch can be performed with a bias voltage from about 30 V to about 800 V at a temperature from about 50° C. to about 90° C. under a pressure from about 1 mTorr to about 20 mTorr. In some embodiments, the biased plasma etch can include etchants of chlorine ($Cl_2$), sulfur hexafluoride (SFS), or nitrogen trifluoride ($NF_3$) with a flow rate ranging from about 1 standard cubic centimeters per minute (sccm) to about 200 sccm. In some embodiments, the biased plasma etch can include etchants of hydrofluorocarbon such as trifluoromethane ($CHF_3$) and fluoromethane ($CH_3F$) with a flow rate ranging from about 30 sccm to about 120 sccm. In some embodiments, the biased plasma etch can include a clean gas such as hydrogen ($H_2$), nitrogen ($N_2$), carbon dioxide ($CO_2$), and a combination thereof at a flow rate ranging from about 50 sccm to about 200 sccm. In some embodiments, the biased plasma etch can include a carrier gas such as argon (Ar) and helium (He) at a flow rate ranging from about 50 sccm to about 1000 sccm.

In some embodiments, the first anisotropic etch can be controlled by time and fin structures 108 can be formed after the first anisotropic etch. As shown in FIG. 8, fin structures 108 can have horizontal dimension 108-1w (e.g., width) along a Y-axis direction ranging from about 5 nm to about 50 nm. Fin structures 108 can have a vertical dimension 108h (e.g., height) along a Z-axis direction ranging from about 150 nm to about 200 nm. In some embodiments, the first anisotropic etch can form fin bottom portions of fin structures 108 in subsequent processes.

The first anisotropic etch can be followed by the formation of STI regions 106 and removal of hard mask layer 730, as shown in FIG. 9. In some embodiments, STI regions 106 can be formed by depositing a dielectric material by FCVD or other suitable deposition methods. The dielectric material can include, such as silicon oxide, silicon nitride, silicon oxynitride, FSG, a low-k dielectric material, and other suitable insulating materials. In some embodiments, STI regions 106 can include a multi-layered structure. The deposition of the dielectric material for STI regions 106 can be followed by a chemical mechanical polishing (CMP)

process to remove hard mask layer 730 and to coplanarize top surfaces of amorphous layer 107 and STI regions 106.

Figure 10:
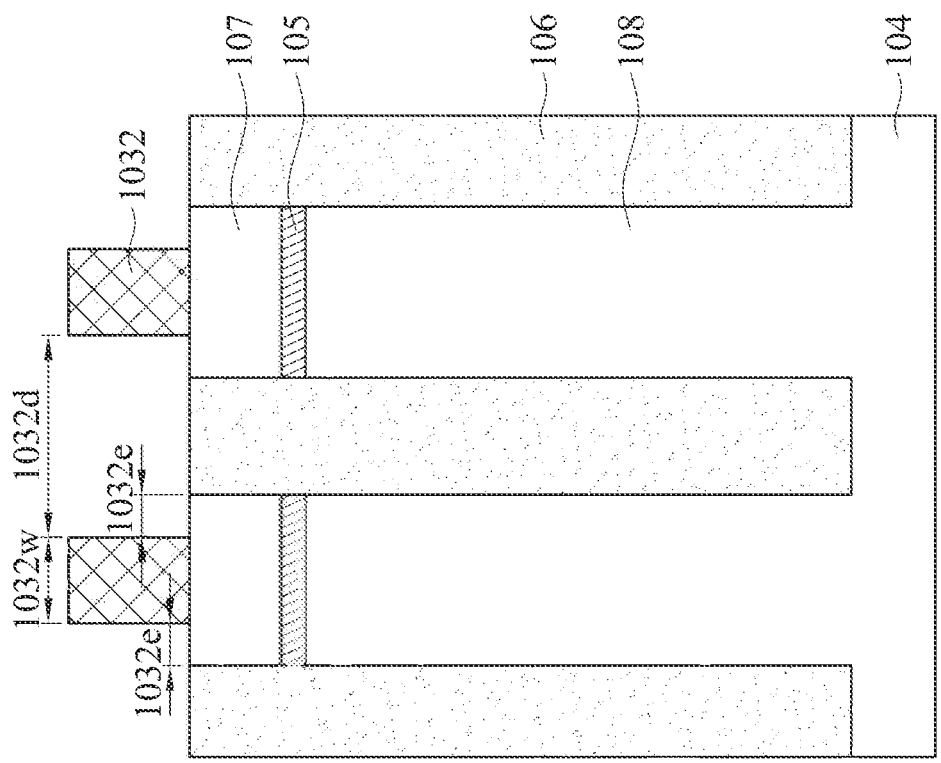
Figure 11:
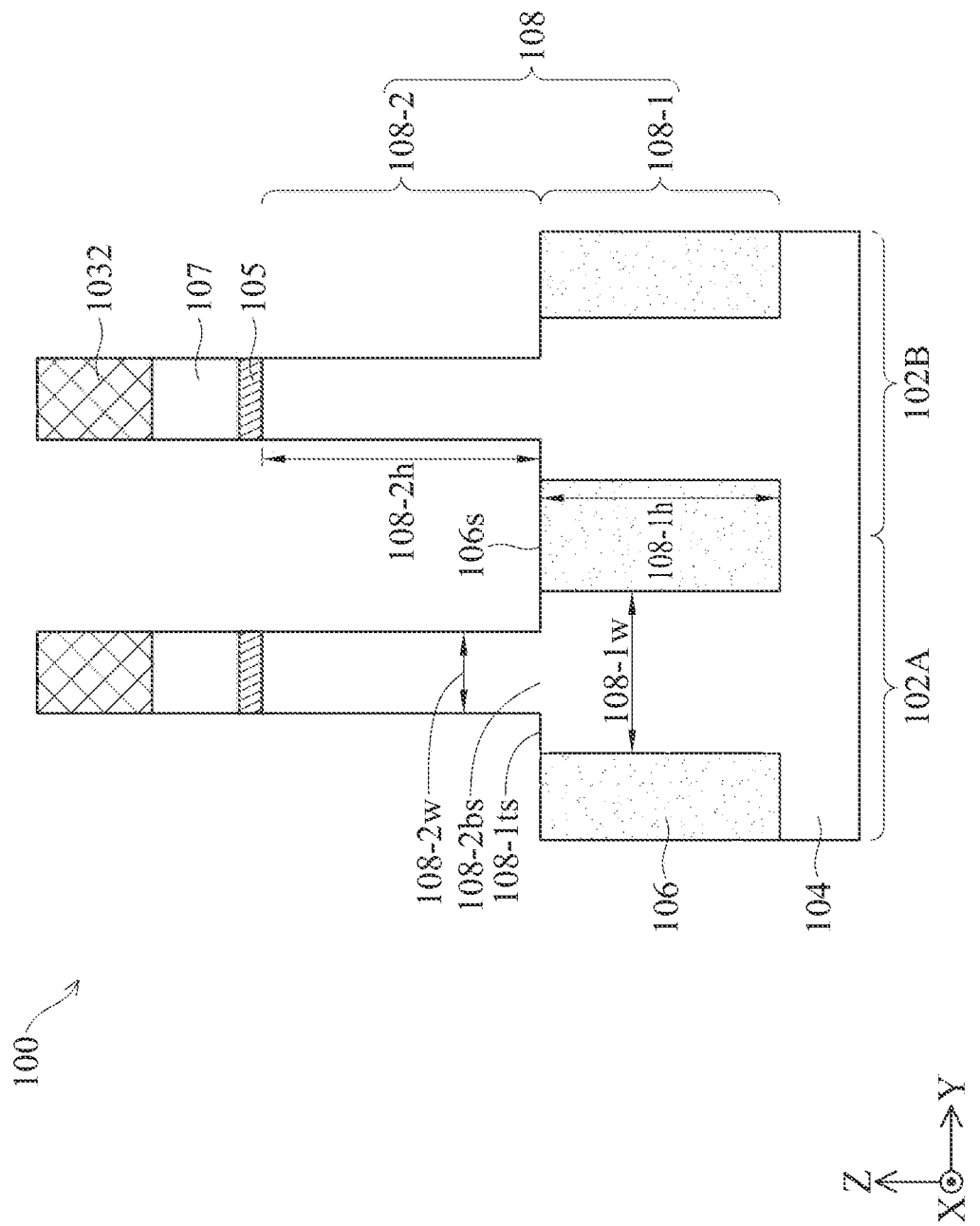
Figure 12:
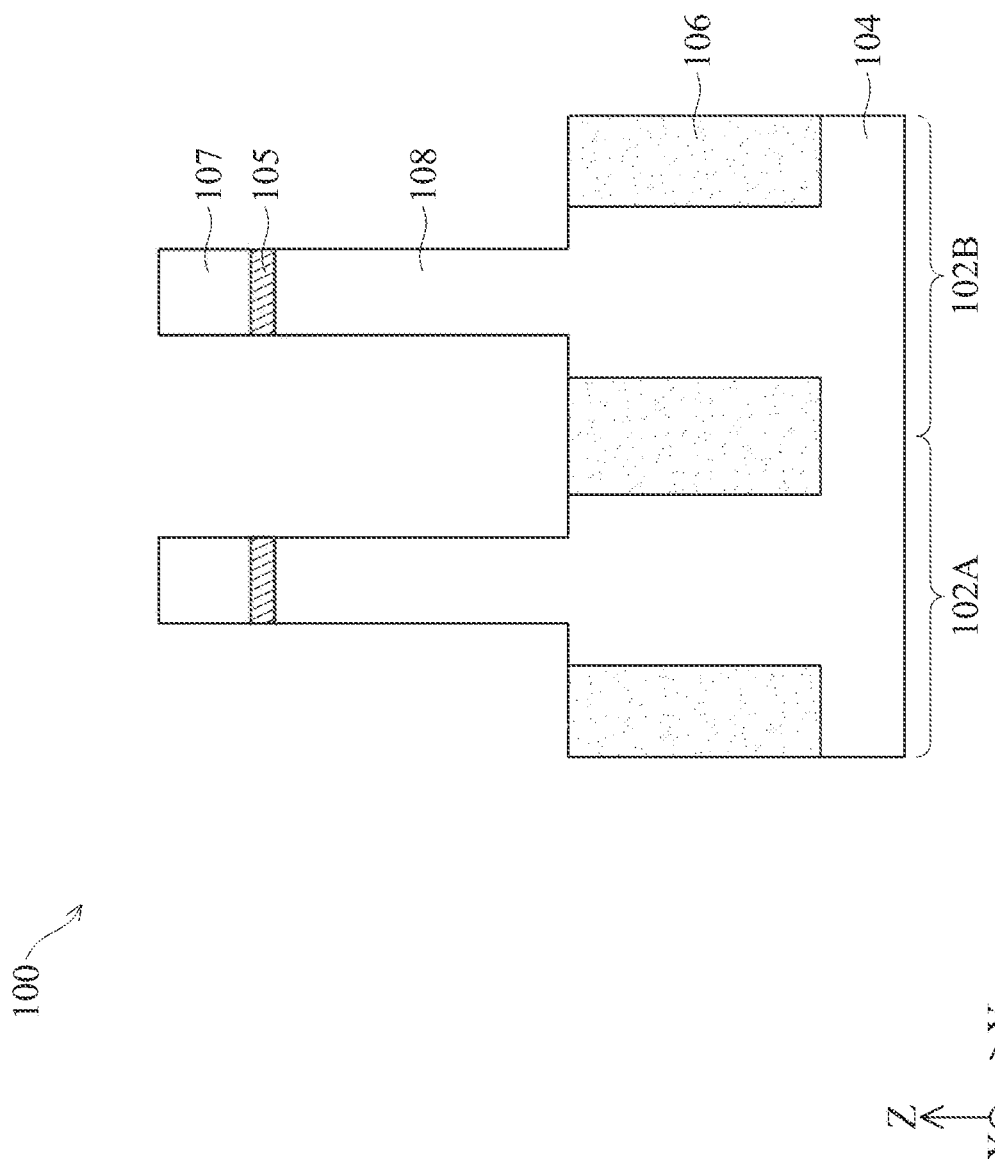

Referring to FIG. 6, in operation 640, a portion of the amorphous layer, a portion of the dielectric layer, and a portion of the fin structure can be removed to expose top surfaces of a bottom portion of the fin structure. For example, as shown in FIGS. 10-12, a portion of amorphous layer 107, a portion of dielectric layer 105, and a portion of fin structures 108 can be removed to expose top surface 108-1ts of fin bottom portions 108-1. In some embodiments, the removal process can include formation of hard mask layer 1032 and a second anisotropic etch.

As shown in FIG. 10, patterned hard mask layer 1032 can be formed on amorphous layer 107. In some embodiments, hard mask layer 1032 can include a stack of dielectric layers and photoresist similar to hard mask layer 730. Hard mask layer 1032 can be patterned to have a horizontal dimension 1032w (e.g., width) along a Y-axis direction ranging from about 1 nm to about 10 nm. A distance 1032e along a Y-axis between edges of hard mask layer 1032 and edges of fin structures 108 can range from about 2 nm to about 20 nm. Adjacent hard mask layer 1032 can have a horizontal dimension 1032d (e.g., distance) along a Y-axis direction ranging from about 10 nm to about 150 nm. Hard mask layer 1032 can be patterned to subsequently form fin top portions 108-2 of fin structures 108.

The formation of hard mask layer 1032 can be followed by the second anisotropic etch, as shown in FIG. 11. In some embodiments, the second anisotropic etch can be the same as or similar to the first anisotropic etch. After the second anisotropic etch, amorphous layer 107, dielectric layer 105, and substrate 104 can be further etched anisotropically to form fin top portions 108-2 of fin structures 108, as shown in FIG. 11. In some embodiments, the second anisotropic etch can be non-selective and can form vertical sidewalls for fin top portions 108-2 of fin structures 108.

In some embodiments, the second anisotropic etch can be a biased plasma etch similar to the first anisotropic etch and performed under conditions similar to the first anisotropic etch. In some embodiments, the second anisotropic etch can be controlled by time and fin top portions 108-2 can be formed after the second anisotropic etch. During the second anisotropic etch, a portion of amorphous layer 107, a portion of dielectric layer 105, and a portion of fin structures 108 can be removed to expose top surface 108-1ts of fin bottom portions 108-1. As shown in FIG. 11, fin structures 108 can include fin bottom portions 108-1 and fin top portions 108-2. Fin top portions 108-2 can have horizontal dimension 108-2w (e.g., width) along a Y-axis direction ranging from about 1 nm to about 10 nm. Fin top portions 108-2 can have vertical dimension 108-2h (e.g., height) along a Z-axis direction ranging from about 50 nm to about 100 nm. In some embodiments, a ratio of horizontal dimension 108-2w to horizontal dimension 108-1w can range from about 0.1 to about 0.9.

The formation of fin structures 108 having fin top portions 108-2 and fin bottom portions 108-1 can be followed by the formation of S/D epitaxial structures 110, as shown in FIG. 2. Prior to the formation of S/D epitaxial structures 110, hard mask layer 1032 can be removed from amorphous layer 107 by a selective etching process, as shown in FIG. 12. In some embodiments, facet-free S/D epitaxial structures 110 can be conformally formed on the top surface of amorphous layer 107, sidewall surfaces of amorphous layer 107, dielectric layer 105, and fin top portions 108-2, and top surface 108-1ts of fin bottom portions 108-1, as shown in FIGS. 1 and 2. Facet-free S/D epitaxial structures 110 with a substantially uniform thickness can be epitaxially grown by (i) CVD, such as low pressure CVD (LPCVD), atomic layer CVD (AL-CVD), ultrahigh vacuum CVD (UHVCVD), reduced pressure CVD (RPCVD), and any suitable CVD; (ii) molecular beam epitaxy (MBE) processes; (iii) any suitable epitaxial process; or (iv) a combination thereof. In some embodiments, S/D epitaxial structures 110 can be grown by an epitaxial deposition/partial etch process, which repeats the epitaxial deposition/partial etch process at least once. Such repeated deposition/partial etch process can be referred to as a cyclic deposition-etch (CDE) process. The CDE process can reduce epitaxial defects formed during the growth and can control the profiles of S/D epitaxial structures 110. In some embodiments, S/D epitaxial structures 110 can include multiple epitaxial layers and can be in-situ doped with n-type or p-type dopants during the epitaxial growth process.

In some embodiments, as shown in FIG. 2, S/D epitaxial structures 110 can include first epitaxial portion 110-1 and second epitaxial portion 110-2. Second epitaxial portion 110-2 formed on amorphous layer 107 and dielectric layer 105 can be amorphous or multi-crystalline as a result of underlying non-crystalline growth seeding layers. Amorphous layer 107 and dielectric layer 105 can prevent facet formation of second epitaxial portion 110-2. Amorphous or multi-crystalline second epitaxial portion 110-2 can be conformally formed and facet-free on amorphous layer 107 and dielectric layer 105. In some embodiments, as shown in FIG. 2, first epitaxial portion 110-1 formed on fin top portions 108-1 and fin bottom portion 108-2 can be crystalline as a result of underlying crystalline growth seeding layers. Crystalline epitaxial structures grown on free surfaces can have non-uniform thickness and form certain shapes having facets, such as diamond shapes, according to the crystalline properties. However, crystalline epitaxial structures grown on confined surfaces can form facet-free epitaxial layers with a substantially uniform thickness. First epitaxial portion 110-1 formed on fin top portions 108-1 can be confined by amorphous or multi-crystalline second epitaxial portion 110-2 and top surface 108-1ts of fin bottom portion 108-2. As a result, fin bottom portion 108-2 with top surface 108-1ts can prevent facet formation of first epitaxial portion 110-1. First epitaxial portion 110-1 can be conformally formed and facet-free on sidewall surfaces of fin top portions 108-2.

With the control of amorphous layer 107, fin top portions 108-2, and fin bottom portions 108-1, facet-free S/D epitaxial structures 110 with a substantially uniform thickness can be conformally formed on amorphous layer 107 and fin structures 108 to improve device performance and process yield of semiconductor device 100. In some embodiments, semiconductor device 100 having facet-free S/D epitaxial structures 110 with a substantially uniform thickness can improve process yield by about 2% to about 20% and improve device performance by about 2% to about 10%.

The formation of S/D epitaxial structures 110 can be followed by the formation of ESL 117 on STI regions 106, S/D epitaxial structures 110, and sides of gate spacers 114, the formation of ILD layer 118 on ESL 117, and the formation of S/D contact structures 121 on S/D epitaxial structures 110, as shown in FIG. 1. The formation of S/D contact structures 121 can include a selective etch to remove ILD layer 118 around S/D epitaxial structures 110 and deposition of conductive materials on top and sidewall surfaces of S/D epitaxial structures 110.

Figure 13:
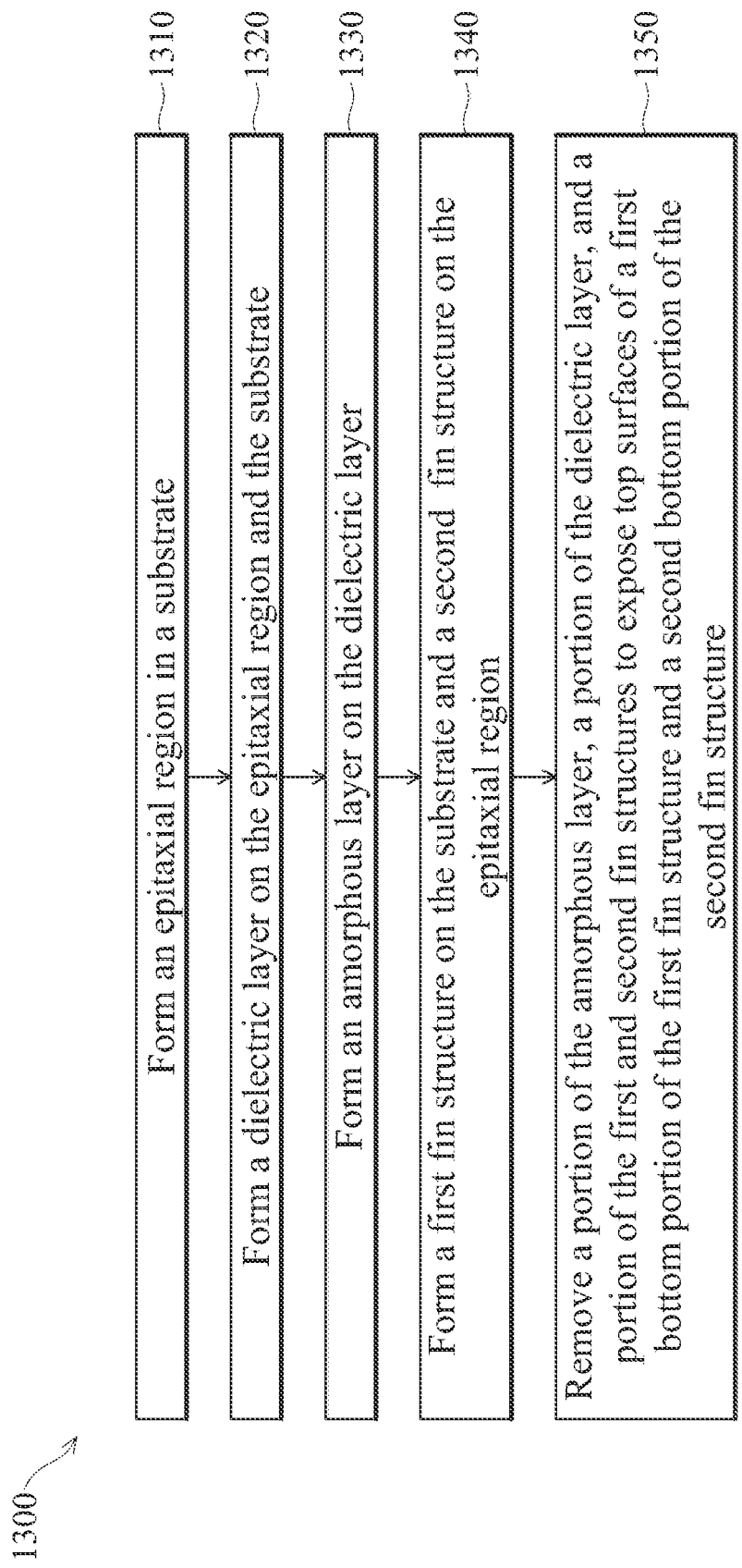
FIG. 13 is another flow diagram of a method for fabricating a semiconductor device having facet-free epitaxial structures, in accordance with some embodiments.

FIG. 13 is a flow diagram of a method 1300 for fabricating semiconductor device 100 having facet-free S/D epitaxial structures 110, in accordance with some embodiments. Method 1300 may not be limited to finFET devices and can be applicable to devices that would benefit from facet-free S/D epitaxial structures, such as planar FETs, finFETs, GAA FETs, and other semiconductor devices. Additional fabrication operations may be performed between various operations of method 1300 and may be omitted merely for clarity and ease of description. Additional processes can be provided before, during, and/or after method 1300; one or more of these additional processes are briefly described herein. Moreover, not all operations may be needed to perform the disclosure provided herein. Additionally, some of the operations may be performed simultaneously or in a different order than shown in FIG. 13. In some embodiments, one or more other operations may be performed in addition to or in place of the presently described operations.

For illustrative purposes, the operations illustrated in FIG. 13 will be described with reference to the example fabrication process for fabricating semiconductor device 100 as illustrated in FIGS. 14-22. FIGS. 14-22 illustrate cross-sectional views of semiconductor device 100 having facet-free S/D epitaxial structures 110 at various stages of its fabrication, in accordance with some embodiments. Elements in FIGS. 7-12 with the same annotations as elements in FIGS. 1-3 are described above.

Figure 14:
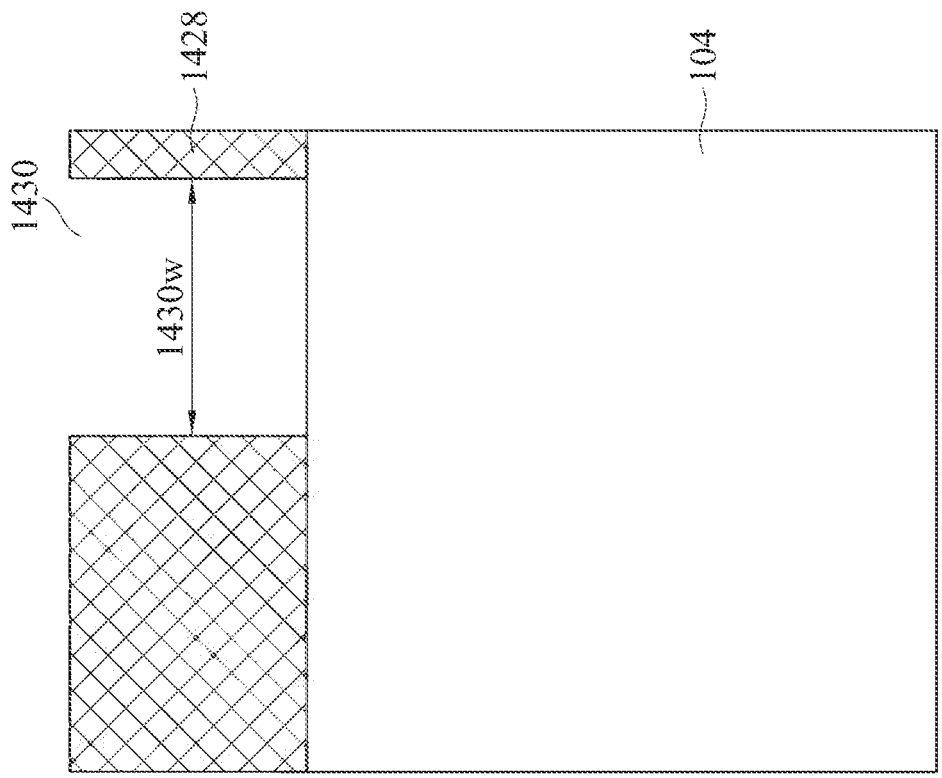
FIGS. 14-22 illustrate cross-sectional views of another semiconductor device having facet-free epitaxial structures at various stages of its fabrication, in accordance with some embodiments.
Figure 15:
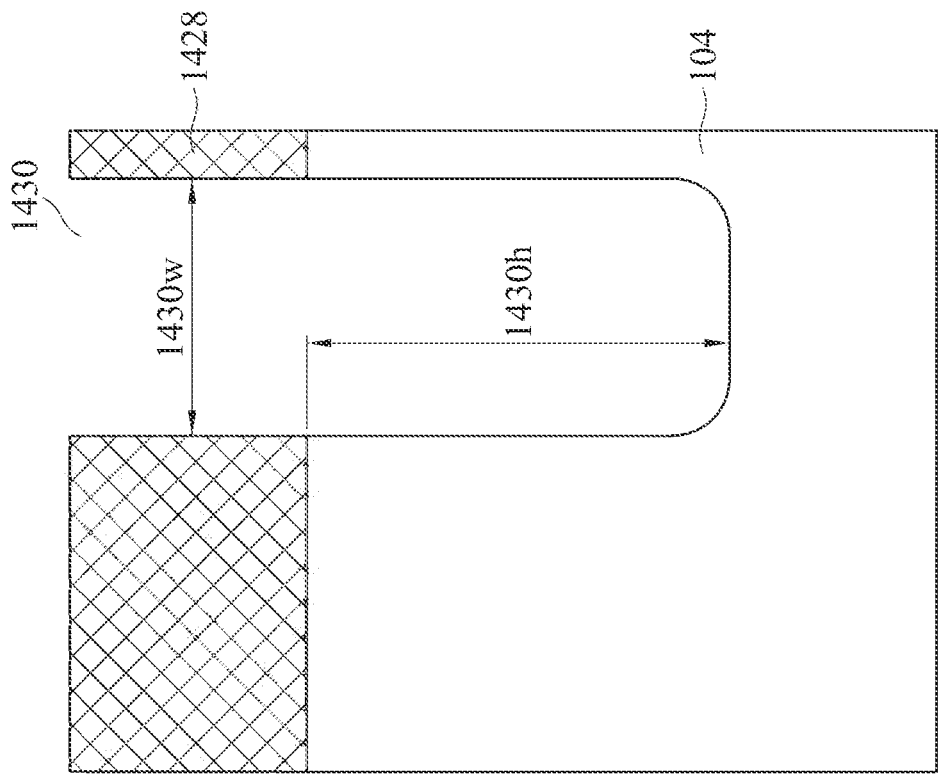
Figure 16:
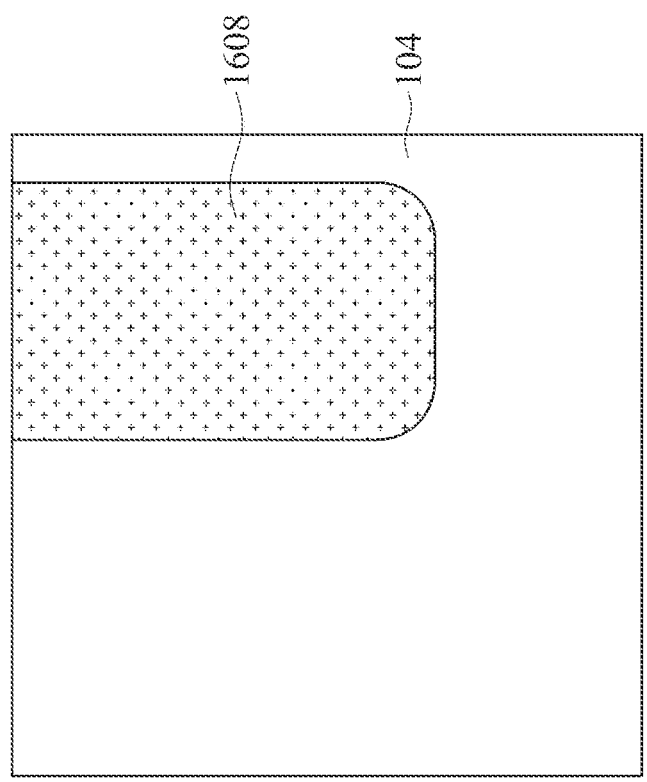

In referring to FIG. 13, method 1300 begins with operation 1310 and the process of forming an epitaxial region in a substrate. For example, as shown in FIGS. 14-16, an epitaxial region 1608 can be formed in substrate 104. Referring to FIG. 14, a hard mask layer 1428 can be deposited on substrate 104 and patterned to have an opening 1430. In some embodiments, hard mask layer 1428 can include a stack of layers including dielectric layers and photoresist. In some embodiments, hard mask layer 1428 can include $SiO_x$, $SiN_x$, and other suitable dielectric materials deposited by CVD, PVD, and other suitable deposition methods. In some embodiments, opening 1430 can have a horizontal dimension 1430w (e.g., width) along a Y-axis ranging from about 50 nm to about 500 μm.

The formation of patterned hard mask layer 1428 can be followed by an anisotropic etch of substrate 104, as shown in FIG. 15. In some embodiments, the anisotropic etch of substrate 104 can be a biased plasma etch or other suitable etching method similar to the first anisotropic etch in operation 630. After the anisotropic etch of substrate 104, substrate 104 can be recessed by a vertical dimension 1430h (e.g., height) along a Z-axis ranging from about 50 nm to about 200 nm.

The anisotropic etch of substrate 104 can be followed by the formation of epitaxial region 1608, as shown in FIG. 16. After the anisotropic etch of substrate 104, epitaxial region 1608 can be grown in opening 1430. Epitaxial region 1608 can be epitaxially grown by CVD, MBE, or other suitable epitaxial processes, similar to the growth of S/D epitaxial structures 110 as described above. In some embodiments, epitaxial region 1608 can include a semiconductor material different from substrate 104. For example, substrate 104 can include silicon and epitaxial region 1608 can include silicon germanium. The growth of epitaxial region 1608 can be followed by removal of hard mask layer 1428 and a CMP process to coplanarize top surfaces of epitaxial region 1608 and substrate 104.

Figure 17:
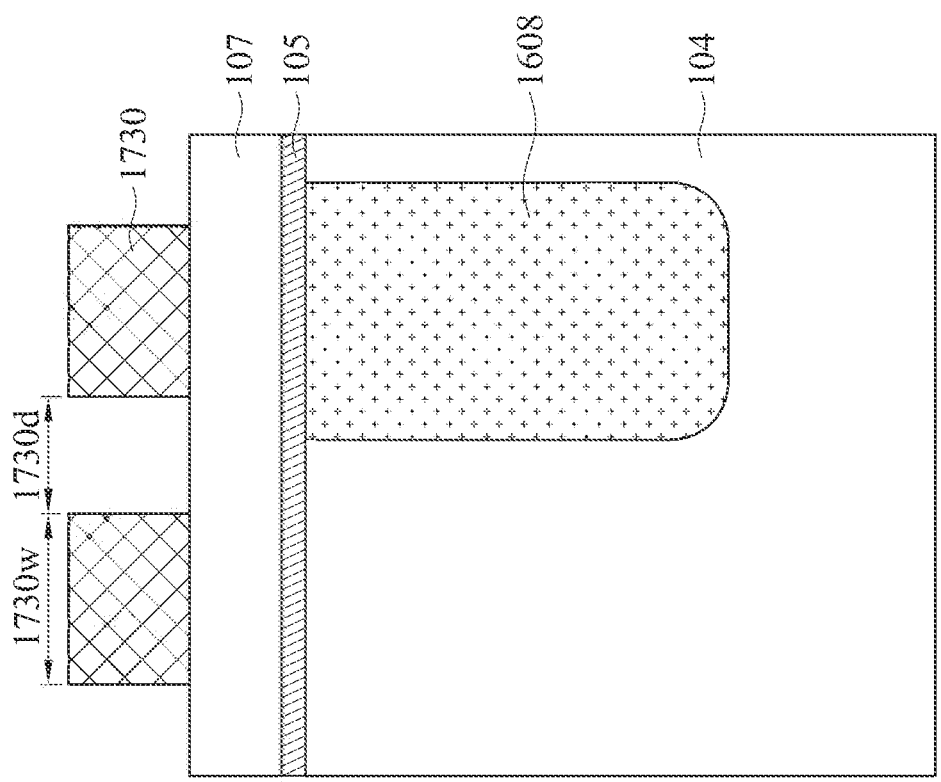

Referring to FIG. 13, in operation 1320, a dielectric layer can be formed on the epitaxial region and the substrate. For example, as shown in FIG. 17, dielectric layer 105 can be formed on epitaxial region 1608 and substrate 104. In some embodiments, operation 1320 can be similar to operation 610. In some embodiments, dielectric layer 105 can be blanket deposited on substrate 104 by a deposition method described in operation 610. In some embodiments, dielectric layer 105 can include dielectric materials such as $SiO_x$, $SiN_x$, SiON, SiCN, SiOC, SiOCN, and a combination thereof and have vertical dimension 105t along a Z-axis. Dielectric layer 105 can promote formation of an amorphous layer instead of a crystalline epitaxial layer on epitaxial region 1608 and substrate 104.

Referring to FIG. 13, in operation 1330, an amorphous layer can be formed on the dielectric layer. For example, as shown in FIG. 17, amorphous layer 107 can be blanket deposited on dielectric layer 105. In some embodiments, operation 1330 can be similar to operation 620. In some embodiments, amorphous layer 107 can include a layer of amorphous semiconductor material blanket deposited by a deposition method described in operation 620. In some embodiments, amorphous layer 107 can have vertical dimension 107t along a Z-axis. Amorphous layer 107 can prevent damage of fin structures during the formation of the fin structures and promote formation of facet-free S/D epitaxial structures with a substantially uniform thickness.

The formation of amorphous layer 107 can be followed by the formation of patterned hard mask layer 1730, as shown in FIG. 17. In some embodiments, hard mask layer 1730 can include a stack of layers similar to hard mask layer 730. In some embodiments, as shown in FIG. 17, hard mask layer 1730 can have a horizontal dimension 1730w (e.g., width) along a Y-axis direction similar to horizontal dimension 730w ranging from about 5 nm to about 50 nm. Adjacent hard mask layer 1730 can have a horizontal dimension 1730d (e.g., distance) along a Y-axis direction similar to horizontal dimension 730d ranging from about 10 nm to about 100 nm. Hard mask layer 1730 can be patterned to subsequently form fin structures 108A and 108B.

Figure 18:
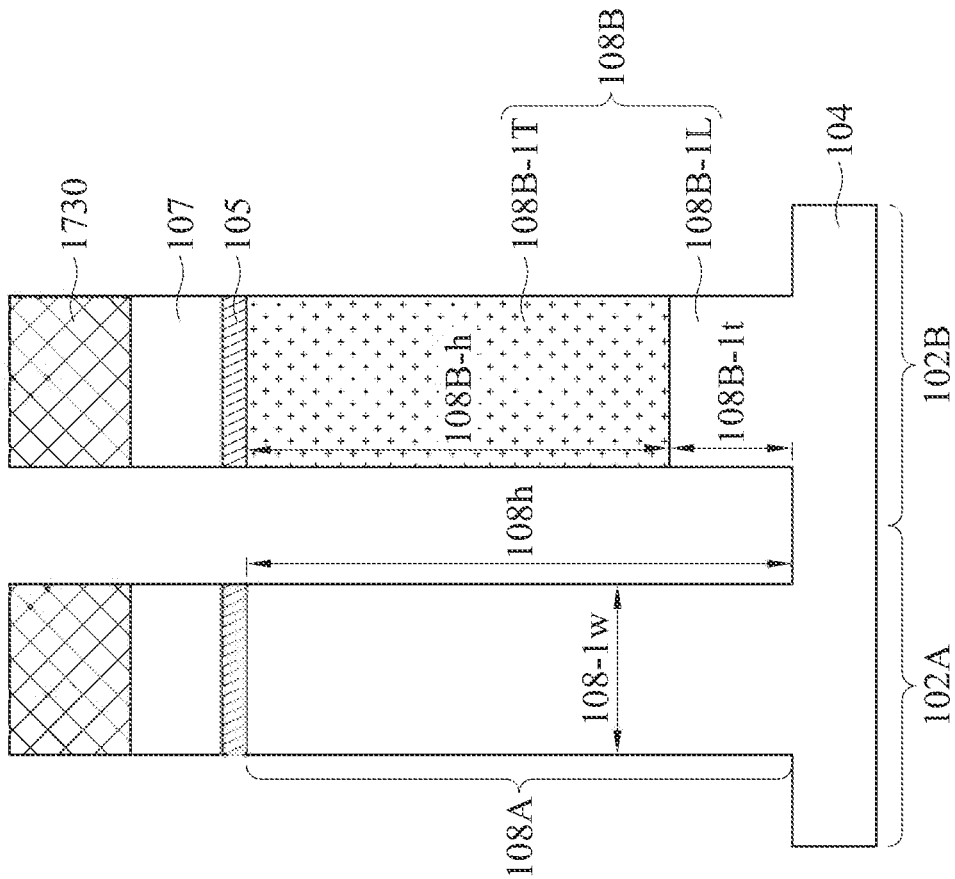
Figure 19:
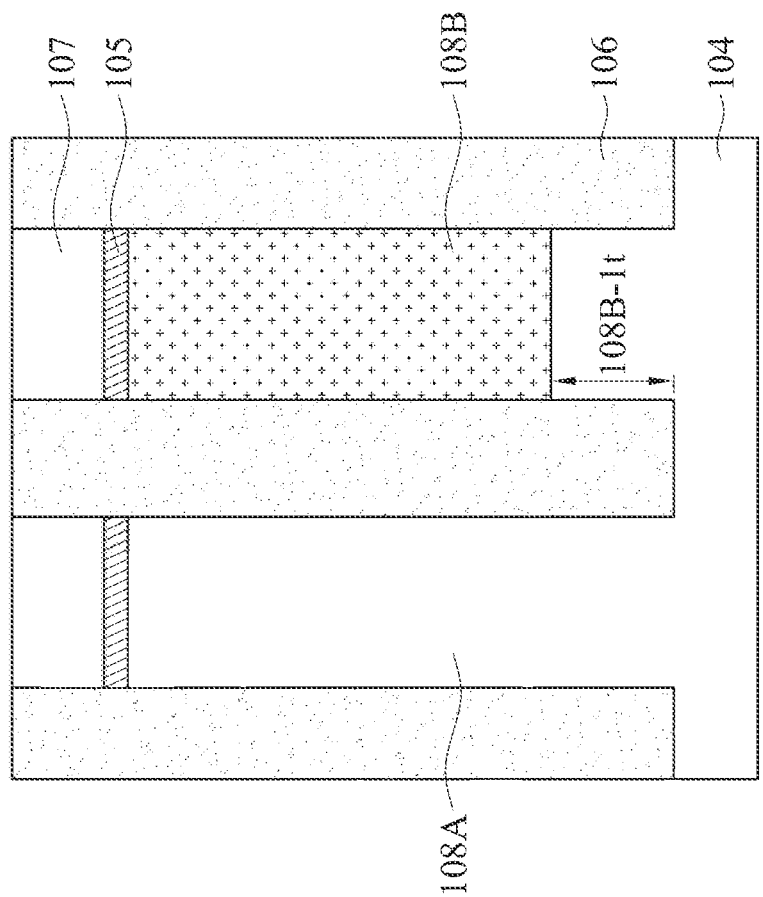

Referring to FIG. 13, in operation 1340, a first fin structure can be formed on the substrate and a second fin structure can be formed on the epitaxial region. For example, as shown in FIGS. 18 and 19, fin structure 108A can be formed on substrate 104 and fin structure 108B can be formed on epitaxial region 1608. In some embodiments, operation 1340 can be similar to operation 630. The formation of fin structures 108A and 108B can include a first anisotropic etch. During the first anisotropic etch, amorphous layer 107, dielectric layer 105, epitaxial region 1608, and substrate 104 can be etched anisotropically to form fin structures 108A and 108B, as shown in FIG. 18. In some embodiments, the first anisotropic etch can be non-selective and can form vertical sidewalls for fin structures 108A and 108B. In some embodiments, the first anisotropic etch in operation 1340 can include etchants similar to the first anisotropic etch in operation 630 and can be performed under conditions similar to the first anisotropic etch in operation 630.

In some embodiments, the first anisotropic etch can be controlled by time and fin structures 108A and 108B can be formed after the first anisotropic etch. As shown in FIG. 18, fin structures 108A and 108B can have horizontal dimension 108-1w (e.g., width) along a Y-axis direction ranging from about 5 nm to about 50 nm. Fin structures 108A and 108B can have a vertical dimension 108h (e.g., height) along a Z-axis direction ranging from about 150 nm to about 200 nm. In some embodiments, fin structure 108B can include a first region 108B-1L and a second region 108B-1T. First region 108B-1L can include a semiconductor material the same as substrate 104 and can have a vertical dimension 108B-1t (e.g., thickness) along a Z-axis direction ranging from about 10 nm to about 20 nm. Second region 108B-1T can include a semiconductor material different from substrate 104 and can have a vertical dimension 108B-h (e.g., height) along a Z-axis direction ranging from about 130 nm to about 190 nm.

The first anisotropic etch can be followed by the formation of STI regions 106 and removal of hard mask layer 1730, as shown in FIG. 19. In some embodiments, STI regions 106 can be formed by depositing a dielectric material by FCVD or other suitable deposition methods. The deposition of the dielectric material for STI regions 106 can be followed by a CMP process to remove hard mask layer 1730 and to coplanarize top surfaces of amorphous layer 107 and STI regions 106.

Figure 21:
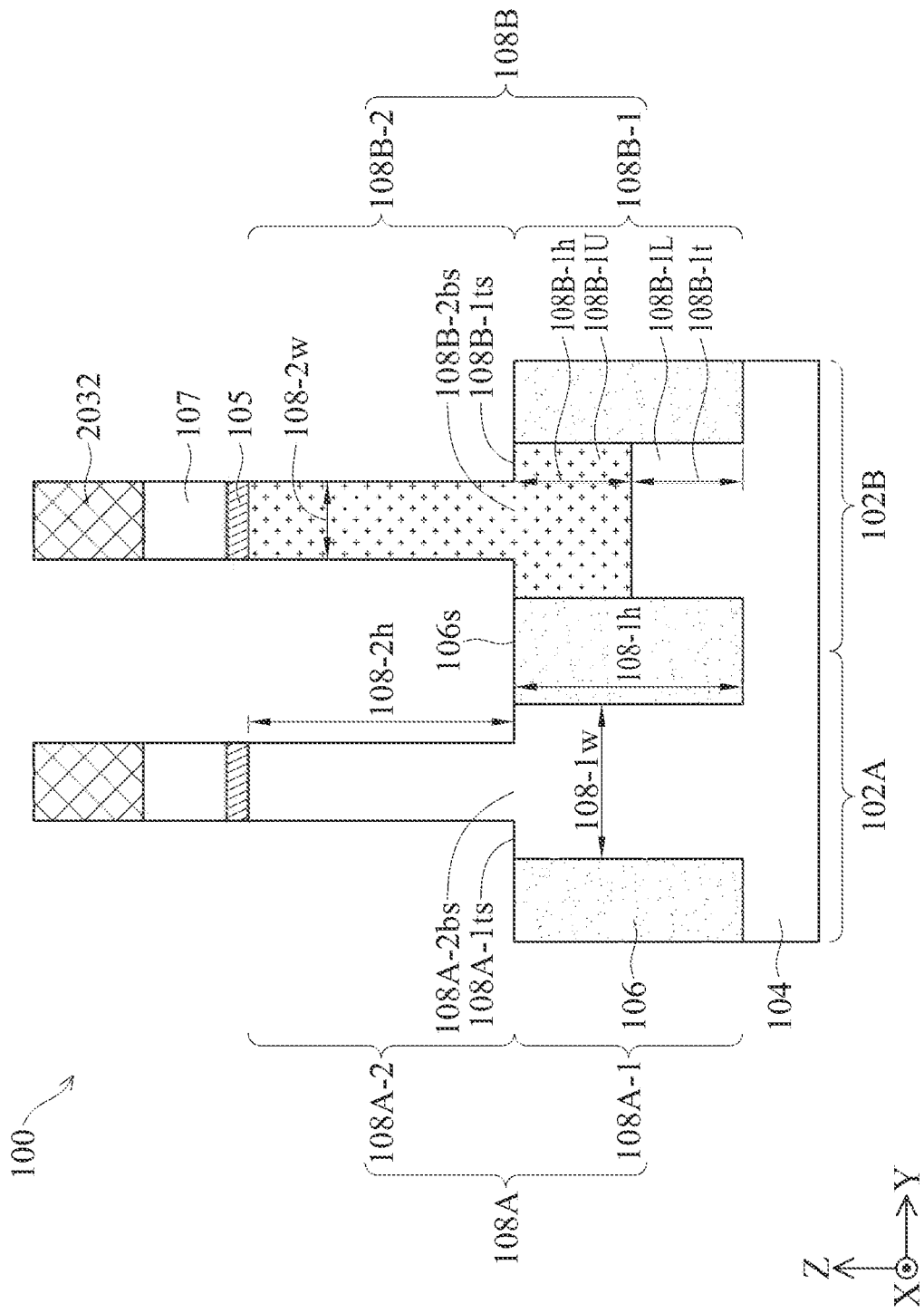
Figure 22:
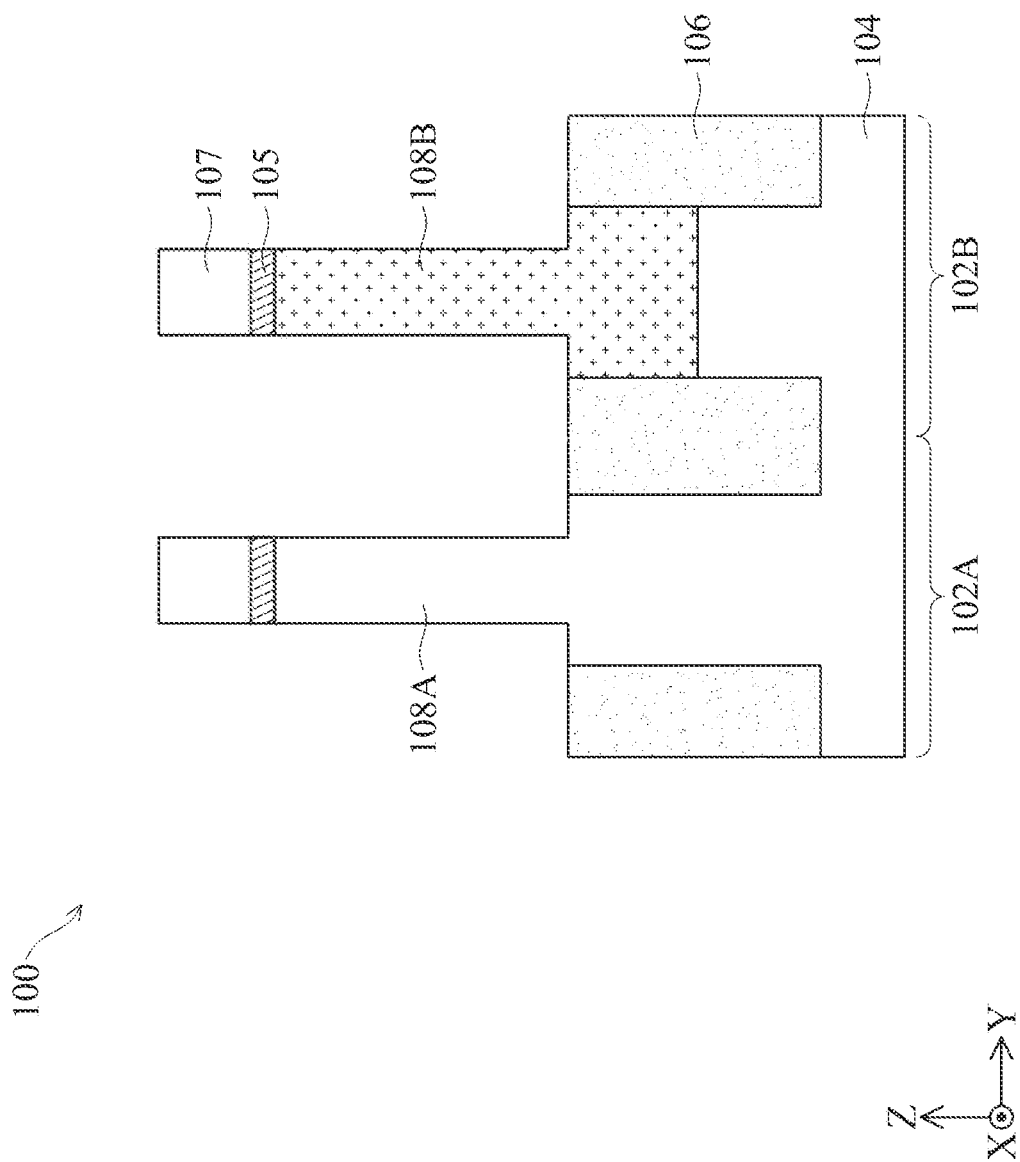

Referring to FIG. 13, in operation 1350, a portion of the amorphous layer, a portion of the dielectric layer, and a portion of the first and second fin structures can be removed to expose top surfaces of a first bottom portion of the first fin structure and a second bottom portion of the second fin structure. For example, as shown in FIGS. 21-22, a portion of amorphous layer 107, a portion of dielectric layer 105, and a portion of fin structures 108A and 108B can be removed to expose top surface 108A-1$ts$ of fin bottom portion 108A-1 and 108B-1$ts$ of fin bottom portion 108B-1. In some embodiments, operation 1350 is similar to operation 640.

Figure 20:
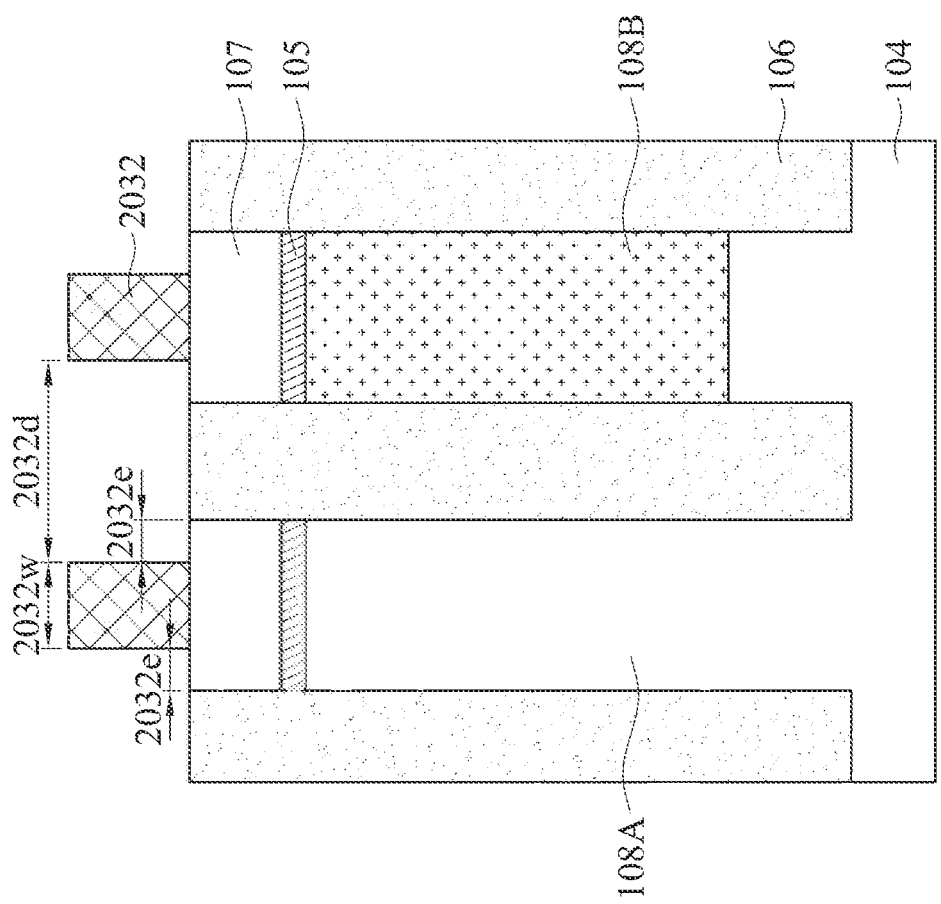

As shown in FIG. 20, patterned hard mask layer 2032 can be formed on amorphous layer 107. In some embodiments, hard mask layer 2032 can include a stack of dielectric layers and photoresist similar to hard mask layer 730. Hard mask layer 2032 can be patterned to have a horizontal dimension 2032$w$ (e.g., width) along a Y-axis direction ranging from about 1 nm to about 10 nm. A distance 2032$e$ along a Y-axis between edges of hard mask layer 2032 and edges of fin structures 108 can range from about 2 nm to about 20 nm. Adjacent hard mask layer 2032 can have a horizontal dimension 2032$d$ (e.g., distance) along a Y-axis direction ranging from about 10 nm to about 150 nm. Hard mask layer 2032 can be patterned to form fin top portions 108A-2 and 108B-2.

The formation of hard mask layer 2032 can be followed by the second anisotropic etch, as shown in FIG. 21. In some embodiments, the second anisotropic etch in operation 1350 can include etchants similar to the second anisotropic etch in operation 640 and can be performed under conditions similar to the second anisotropic etch in operation 640. During the second anisotropic etch, a portion of amorphous layer 107, a portion of dielectric layer 105, and a portion of fin structures 108A and 108B can be removed to expose top surfaces 108A-1$ts$ and 108B-1$ts$.

After the second anisotropic etch, as shown in FIG. 21, fin structure 108A can include fin bottom portion 108A-1 and fin top portion 108A-2. Fin structure 108B can include fin bottom portion 108B-1 and fin top portion 108B-2. Fin top portions 108A-2 and 108B-2 can have horizontal dimension 108-2$w$ and vertical dimension 108-2$h$. Fin bottom portions 108A-1 and 108B-1 can have horizontal dimension 108-1$w$ and vertical dimension 108-1$h$. In some embodiments, a ratio of horizontal dimension 108-2$w$ to horizontal dimension 108-1$w$ can range from about 0.1 to about 0.9.

In some embodiments, fin bottom portion 108B-1 can include first region 108B-1L and second region 108B-1U. First region 108B-1L can have a vertical dimension 108B-1$t$ (e.g., height) along a Z-axis ranging from about 10 nm to about 20 nm. Second region 108B-1U can have a vertical dimension 108B-1$h$ (e.g., height) along a Z-axis ranging from about 10 nm to about 30 nm. First region 108B-1L can include a semiconductor material the same as substrate 104 and second region 108B-1U can include a semiconductor material the same as fin top portion 108B-2. For example, first region 108B-1L and substrate 104 can include silicon and second region 108B-1U and fin top portion 108B-2 can include silicon germanium. Second region 108B-1U and fin top portion 108B-2 can provide growth seed layers for S/D epitaxial structures 110 on fin structure 108B.

The formation of fin structures 108A and 108B can be followed by the formation of S/D epitaxial structures 110, as shown in FIG. 3. Prior to the formation of S/D epitaxial structures 110, hard mask layer 2032 can be removed from by a selective etching process, as shown in FIG. 22. In some embodiments, facet-free S/D epitaxial structures 110 can be conformally formed on the top surface of amorphous layer 107, sidewall surfaces of amorphous layer 107, dielectric layer 105, and fin top portions 108A-2 and 108B-2, and top surfaces 108A-1$ts$ and 108B-1$ts$, as shown in FIG. 3. S/D epitaxial structures 110 in FIG. 3 can be epitaxially grown by a method similar to S/D epitaxial structures 110 in FIG. 2.

With the control of amorphous layer 107, fin top portions 108A-2 and 108B-2, and fin bottom portions 108A-1 and 108B-1, facet-free S/D epitaxial structures 110 with a substantially uniform thickness can be conformally formed on amorphous layer 107 and fin structures 108A and 108B to improve device performance and process yield of semiconductor device 100. In some embodiments, semiconductor device 100 having facet-free S/D epitaxial structures 110 with a substantially uniform thickness can improve process yield by about 2% to about 20% and improve device performance by about 2% to about 10%.

Figure 23:
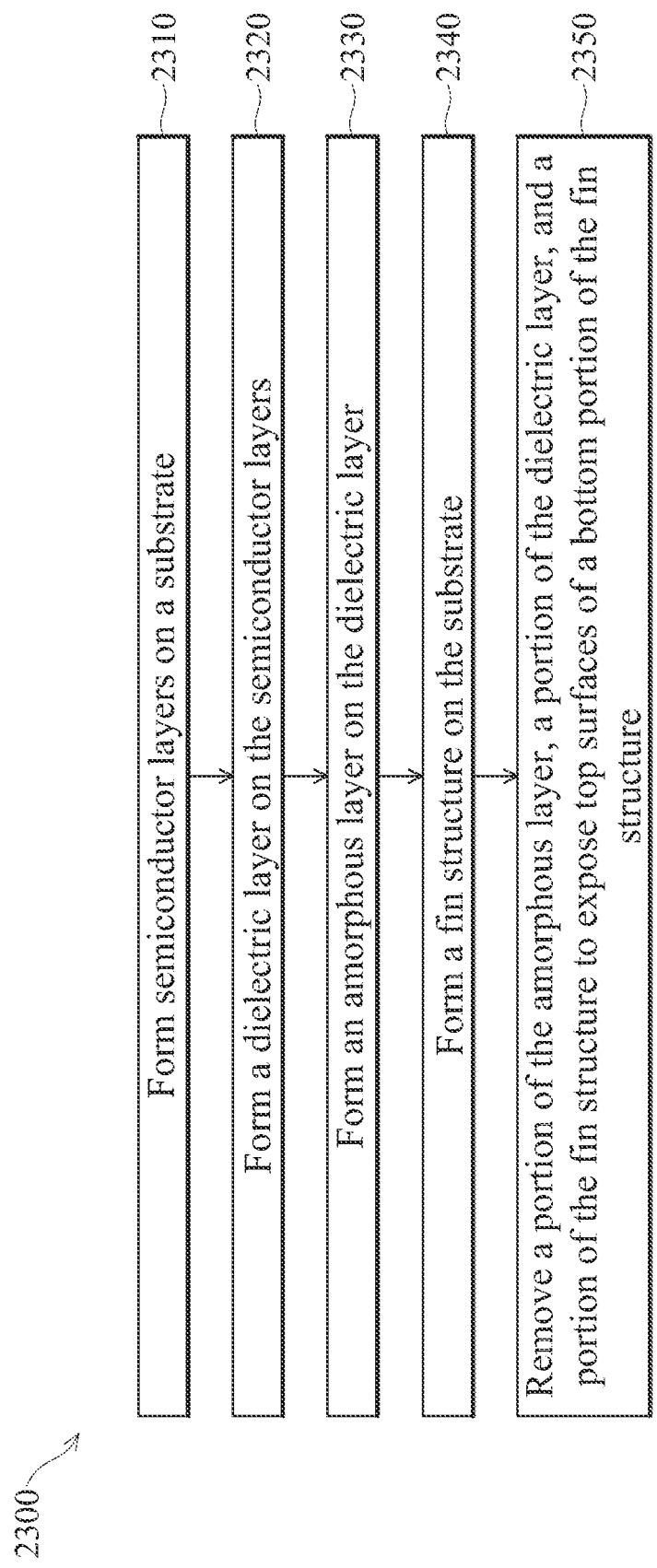
FIG. 23 is yet another flow diagram of a method for fabricating a semiconductor device having facet-free epitaxial structures, in accordance with some embodiments.

FIG. 23 is a flow diagram of a method 2300 for fabricating semiconductor device 100 having facet-free S/D epitaxial structures 110, in accordance with some embodiments. Method 2300 may not be limited to finFET devices and can be applicable to devices that would benefit from facet-free S/D epitaxial structures, such as planar FETs, finFETs, GAA FETs, and other semiconductor devices. Additional fabrication operations may be performed between various operations of method 2300 and may be omitted merely for clarity and ease of description. Additional processes can be provided before, during, and/or after method 2300; one or more of these additional processes are briefly described herein. Moreover, not all operations may be needed to perform the disclosure provided herein. Additionally, some of the operations may be performed simultaneously or in a different order than shown in FIG. 23. In some embodiments, one or more other operations may be performed in addition to or in place of the presently described operations.

For illustrative purposes, the operations illustrated in FIG. 23 will be described with reference to the example fabrication process for fabricating semiconductor device 100 as illustrated in FIGS. 24-33C. FIGS. 24-33C illustrate cross-sectional views of semiconductor device 100 having facet-free S/D epitaxial structures 110 with a substantially uniform thickness at various stages of its fabrication, in accordance with some embodiments. FIGS. 30A, 31A, 32A, and 33A illustrate cross-sectional views of semiconductor device along line B-B in FIG. 1, in accordance with some embodiments. FIGS. 30B, 31B, 32B, and 33B illustrate cross-sectional views of semiconductor device along line A-A in FIG. 1, in accordance with some embodiments. FIGS. 30C, 31C, 32C, and 33C illustrate cross-sectional views of semiconductor device along line C-C in FIG. 1, in accordance with some embodiments. Elements in FIGS. 24-33C with the same annotations as elements in FIGS. 4 and 5 are described above.

Figure 24:
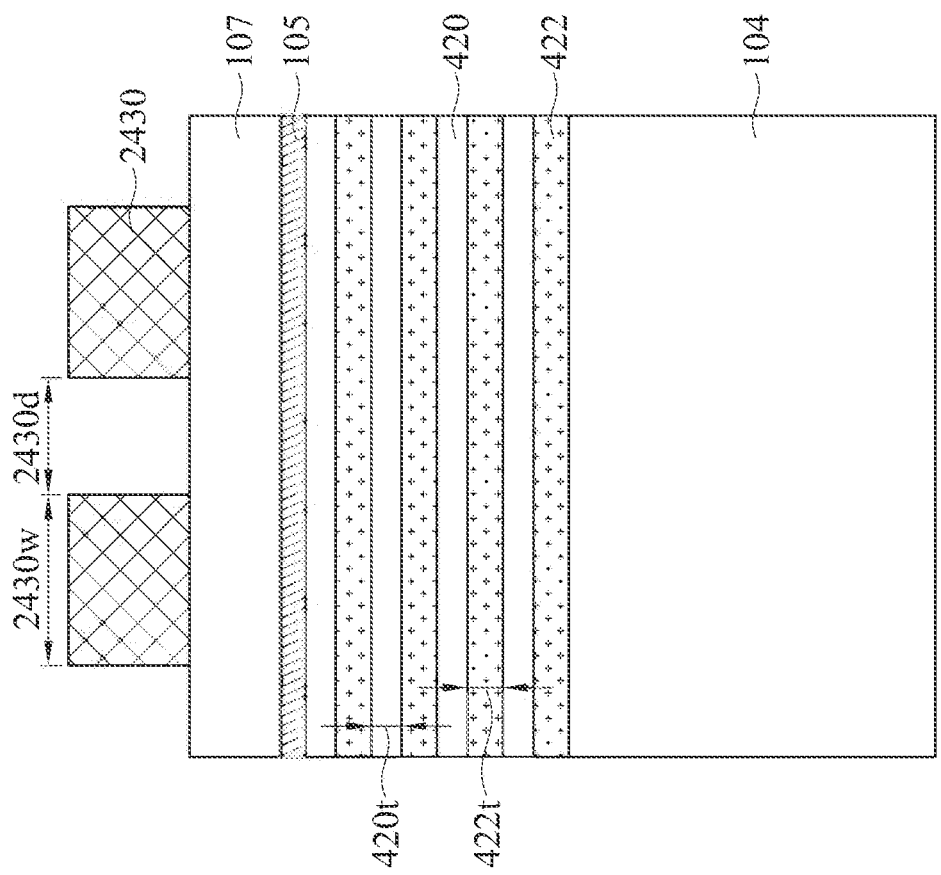

In referring to FIG. 23, method 2300 begins with operation 2310 and the process of forming semiconductor layers on a substrate. For example, as shown in FIG. 24, first and second semiconductor layers 420 and 422 can be formed on substrate 104 and stacked in an alternating configuration. In some embodiments, first and second semiconductor layers 420 and 422 can be epitaxially grown on substrate 104 by a method similar to S/D epitaxial structures 110. In some embodiments, first and second semiconductor layers 420 and 422 can have respective vertical dimensions 420$t$ and 422$t$ (e.g., thickness) along a Z-axis ranging from about 3 nm to about 15 nm. In some embodiments, first and second semiconductor layers 420 and 422 can include different semiconductor materials. For example, first semiconductor layers 420 can include a semiconductor material the same as substrate 104, such as silicon. Second semiconductor layers 422 can include a semiconductor material different fin substrate 104, such as silicon germanium.

Referring to FIG. 23, in operation 2320, a dielectric layer can be formed on the semiconductor layers. For example, as shown in FIG. 24, dielectric layer 105 can be formed on first and second semiconductor layers 420 and 422. In some embodiments, operation 2320 can be similar to operation 610. In some embodiments, dielectric layer 105 can be blanket deposited on first and second semiconductor layers 420 and 422 by a deposition method described in operation 610. In some embodiments, dielectric layer 105 can include dielectric materials such as $SiO_x$, $SiN_x$, SiON, SiCN, SiOC, SiOCN, and a combination thereof and have vertical dimension 105$t$ along a Z-axis. Dielectric layer 105 can promote formation of an amorphous layer instead of a crystalline epitaxial layer on first and second semiconductor layers 420 and 422.

Referring to FIG. 23, in operation 2330, an amorphous layer can be formed on the dielectric layer. For example, as shown in FIG. 24, amorphous layer 107 can be blanket deposited on dielectric layer 105. In some embodiments, operation 2320 can be similar to operation 620. In some embodiments, amorphous layer 107 can include a layer of amorphous semiconductor material blanket deposited by a deposition method described in operation 620. In some embodiments, amorphous layer 107 can have vertical dimension 107$t$ along a Z-axis. Amorphous layer 107 can prevent damage of fin structures during the formation of the fin structures and promote formation of facet-free S/D epitaxial structures with a substantially uniform thickness.

The formation of amorphous layer 107 can be followed by the formation of patterned hard mask layer 2430, as shown in FIG. 24. In some embodiments, hard mask layer 2430 can include a stack of layers similar to hard mask layer 730. In some embodiments, as shown in FIG. 24, hard mask layer 2430 can have a horizontal dimension 2430$w$ (e.g., width) along a Y-axis direction similar to horizontal dimension 730$w$ ranging from about 5 nm to about 50 nm. Adjacent hard mask layer 2430 can have a horizontal dimension 2430$d$ (e.g., distance) along a Y-axis direction similar to horizontal dimension 730$d$ ranging from about 10 nm to about 100 nm. Hard mask layer 2430 can be patterned to subsequently form fin structures 108.

Figure 25:
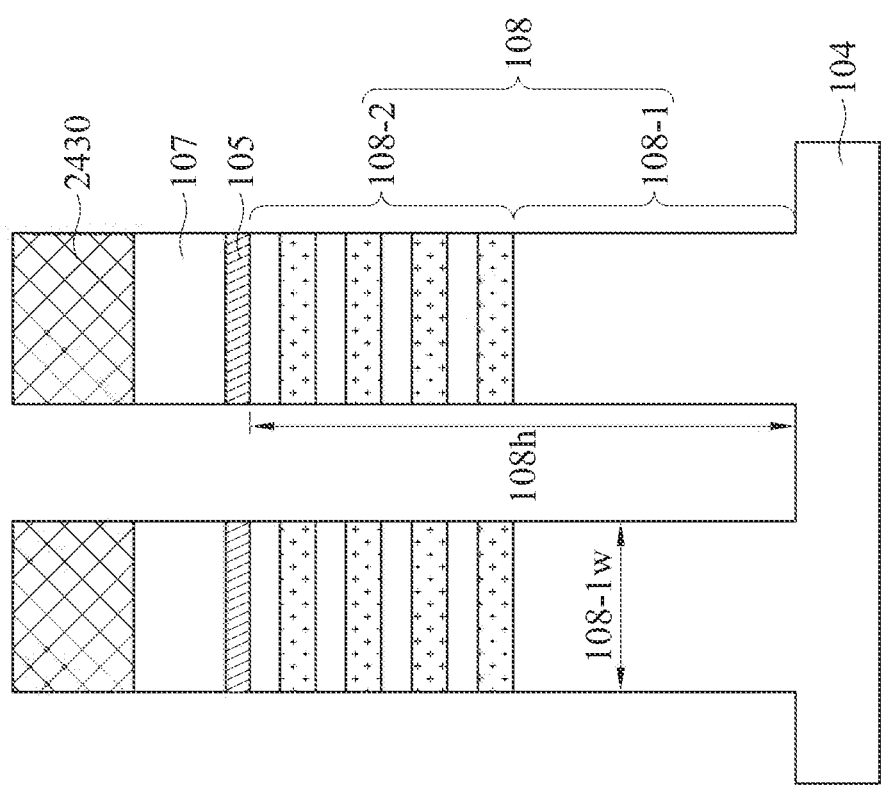
Figure 26:
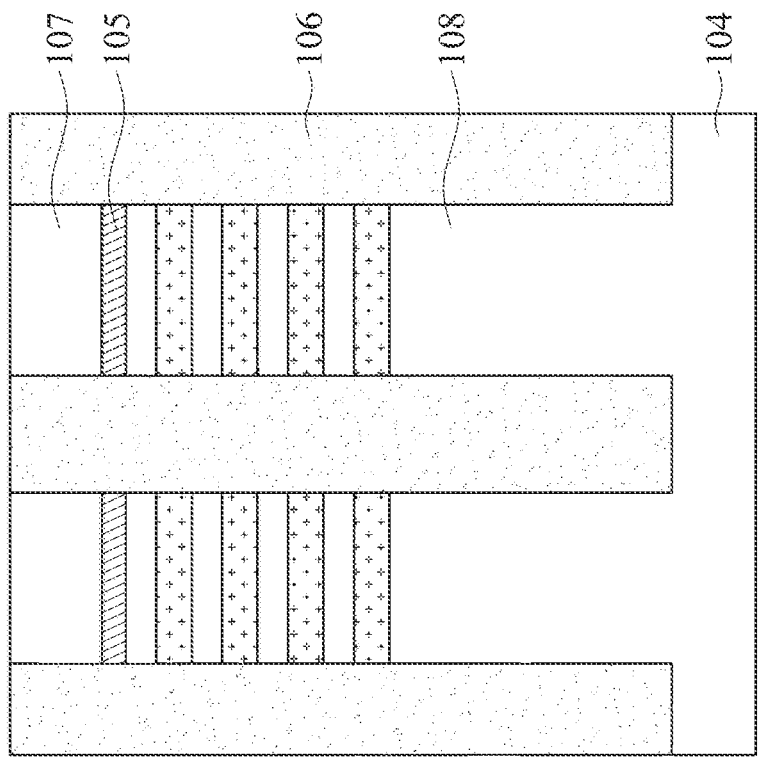

Referring to FIG. 23, in operation 2340, a fin structure can be formed on the substrate. For example, as shown in FIGS. 25 and 26, fin structure 108 can be formed on substrate 104. In some embodiments, operation 2340 can be similar to operation 630. The formation of fin structures 108 can include a first anisotropic etch. During the first anisotropic etch, amorphous layer 107, dielectric layer 105, first and second semiconductor layers 420 and 422, and substrate 104 can be etched anisotropically to form fin structures 108, as shown in FIG. 25. In some embodiments, the first anisotropic etch can be non-selective and can form vertical sidewalls for fin structures 108. In some embodiments, the first anisotropic etch in operation 2340 can include etchants similar to the first anisotropic etch in operation 630 and can be performed under conditions similar to the first anisotropic etch in operation 630.

In some embodiments, the first anisotropic etch can be controlled by time and fin structures 108 can be formed after the first anisotropic etch. As shown in FIG. 25, fin structures 108 can have horizontal dimension 108-1$w$ (e.g., width) along a Y-axis direction ranging from about 5 nm to about 50 nm. Fin structures 108 can have a vertical dimension 108$h$ (e.g., height) along a Z-axis direction ranging from about 150 nm to about 200 nm. In some embodiments, fin structure 108 can include fin top portions 108-2 and fin bottom portions 108-1. Fin top portions 108-2 can include first and second semiconductor layers 420 and 422.

The first anisotropic etch can be followed by the formation of STI regions 106 and removal of hard mask layer 2430, as shown in FIG. 26. In some embodiments, STI regions 106 can be formed by depositing a dielectric material by FCVD or other suitable deposition methods. The deposition of the dielectric material for STI regions 106 can be followed by a CMP process to remove hard mask layer 2430 and to coplanarize top surfaces of amorphous layer 107 and STI regions 106.

Figure 27:
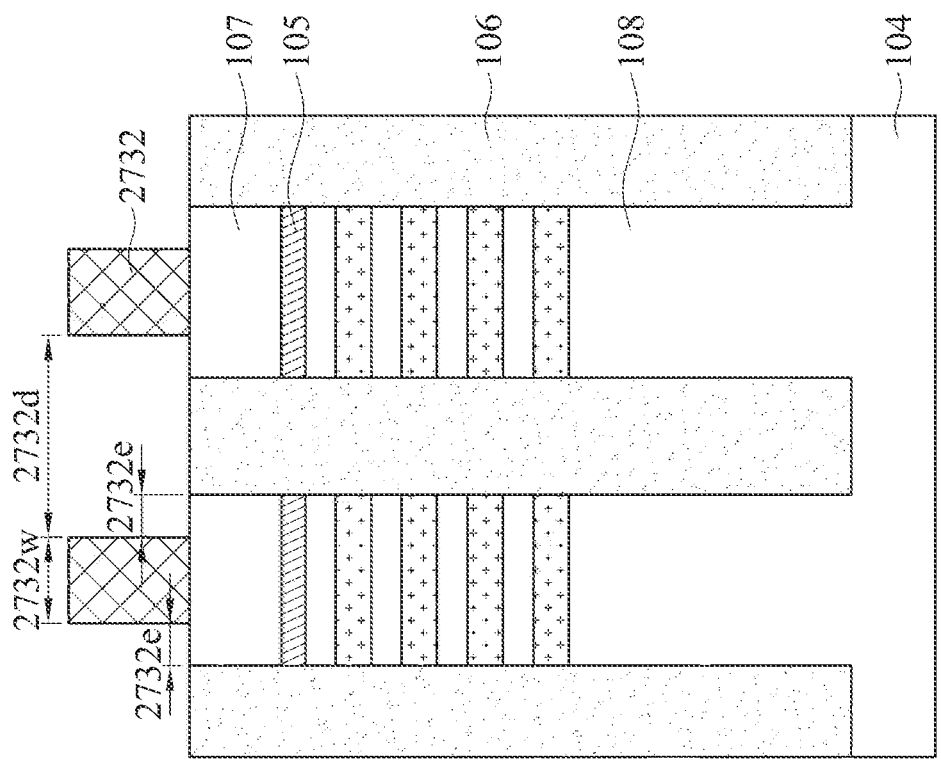
Figure 28:
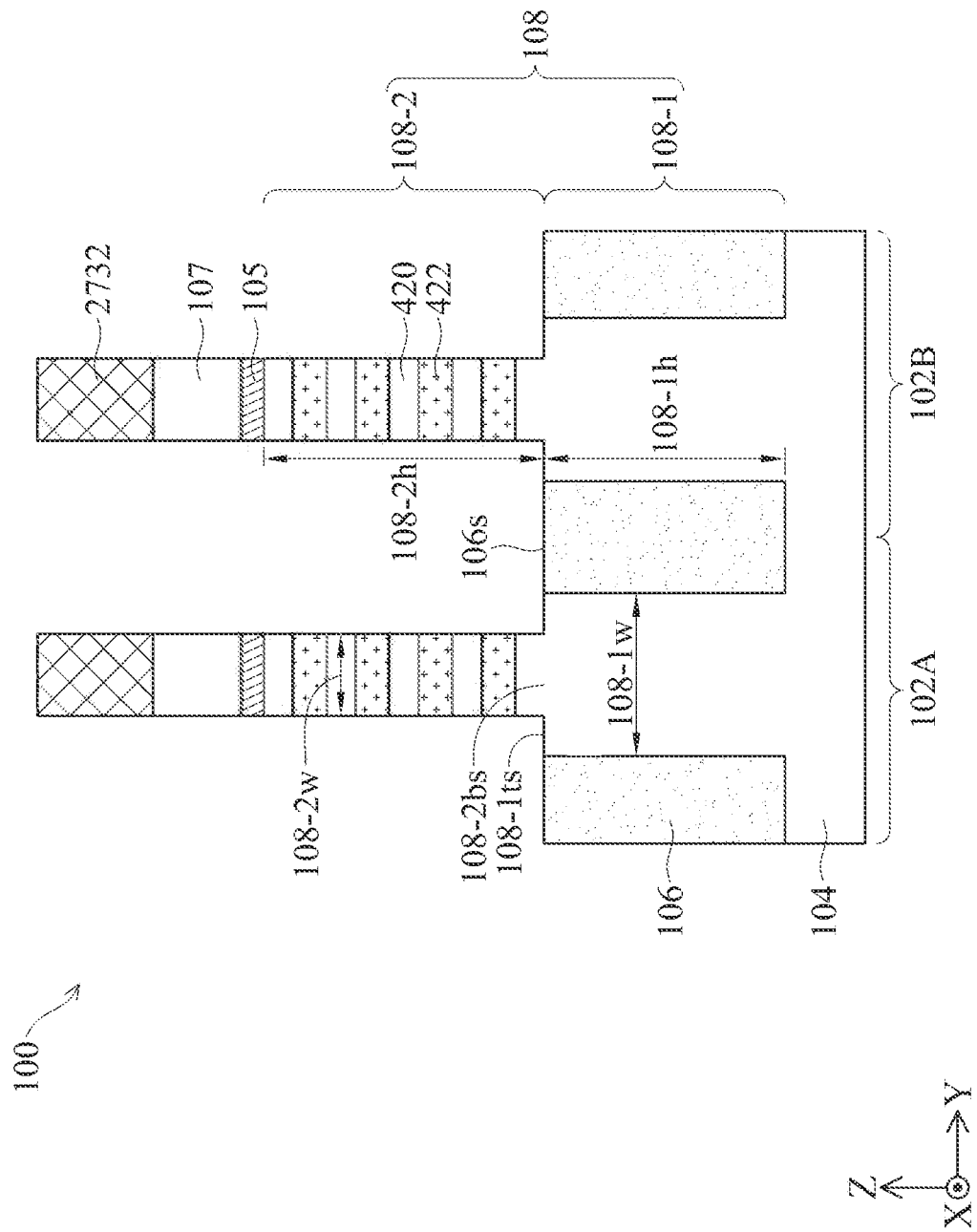
Figure 29:
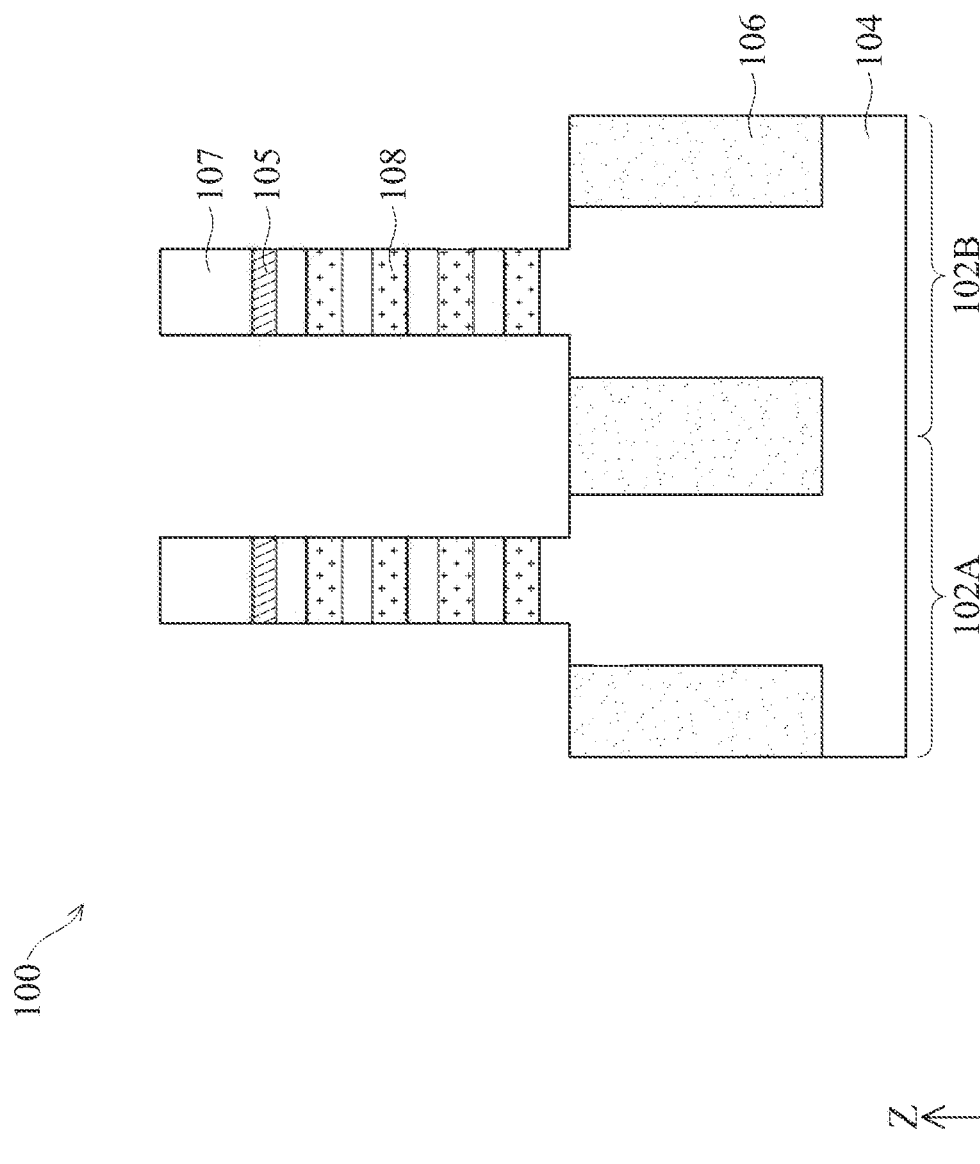

Referring to FIG. 23, in operation 2350, a portion of the amorphous layer, a portion of the dielectric layer, and a portion of the fin structures can be removed to expose top surfaces of a bottom portion of the fin structure. For example, as shown in FIGS. 27-29, a portion of amorphous layer 107, a portion of dielectric layer 105, and a portion of fin structures 108 can be removed to expose top surface 108-1$ts$ of fin bottom portions 108-1. In some embodiments, operation 2350 is similar to operation 640.

As shown in FIG. 27, patterned hard mask layer 2732 can be formed on amorphous layer 107. In some embodiments, hard mask layer 2732 can include a stack of dielectric layers and photoresist similar to hard mask layer 730. Hard mask layer 2732 can be patterned to have a horizontal dimension 2732$w$ (e.g., width) along a Y-axis direction ranging from about 1 nm to about 10 nm. A distance 2732$e$ along a Y-axis between edges of hard mask layer 2732 and edges of fin structures 108 can range from about 2 nm to about 20 nm. Adjacent hard mask layer 2732 can have a horizontal dimension 2732$d$ (e.g., distance) along a Y-axis direction ranging from about 10 nm to about 150 nm. Hard mask layer 2732 can be patterned to form fin top portions 108-2.

The formation of hard mask layer 2732 can be followed by the second anisotropic etch, as shown in FIG. 28. In some embodiments, the second anisotropic etch in operation 2350 can include etchants similar to the second anisotropic etch in operation 640 and can be performed under conditions similar to the second anisotropic etch in operation 640. During the second anisotropic etch, a portion of amorphous layer 107, a portion of dielectric layer 105, and a portion of first and second semiconductor layers 420 and 422 in fin structures 108 can be removed to expose top surface 108-1$ts$.

After the second anisotropic etch, as shown in FIG. 28, fin structures 108 can include fin bottom portions 108-1 and fin top portions 108-2. Fin top portions 108-2 can include first and second semiconductor layers 420 and 422. Fin bottom portions 108-1 can have horizontal dimension 108-1$w$ and vertical dimension 108-1$h$. In some embodiments, a ratio of horizontal dimension 108-2w to horizontal dimension 108-1w can range from about 0.1 to about 0.9.

In some embodiments, the formation of fin structures 108 can be followed by the formation of S/D epitaxial structures 110, as shown in FIG. 4. Prior to the formation of S/D epitaxial structures 110, hard mask layer 2732 can be removed by a selective etching process, as shown in FIG. 29. In some embodiments, facet-free S/D epitaxial structures 110 can be conformally formed on the top surface of amorphous layer 107, sidewall surfaces of amorphous layer 107, dielectric layer 105, first and second semiconductor layers 420 and 422, and top surfaces 108-1*ts*, as shown in FIG. 4. S/D epitaxial structures 110 in FIG. 4 can be epitaxially grown by a method similar to S/D epitaxial structures 110 in FIG. 2.

Figure 30C:
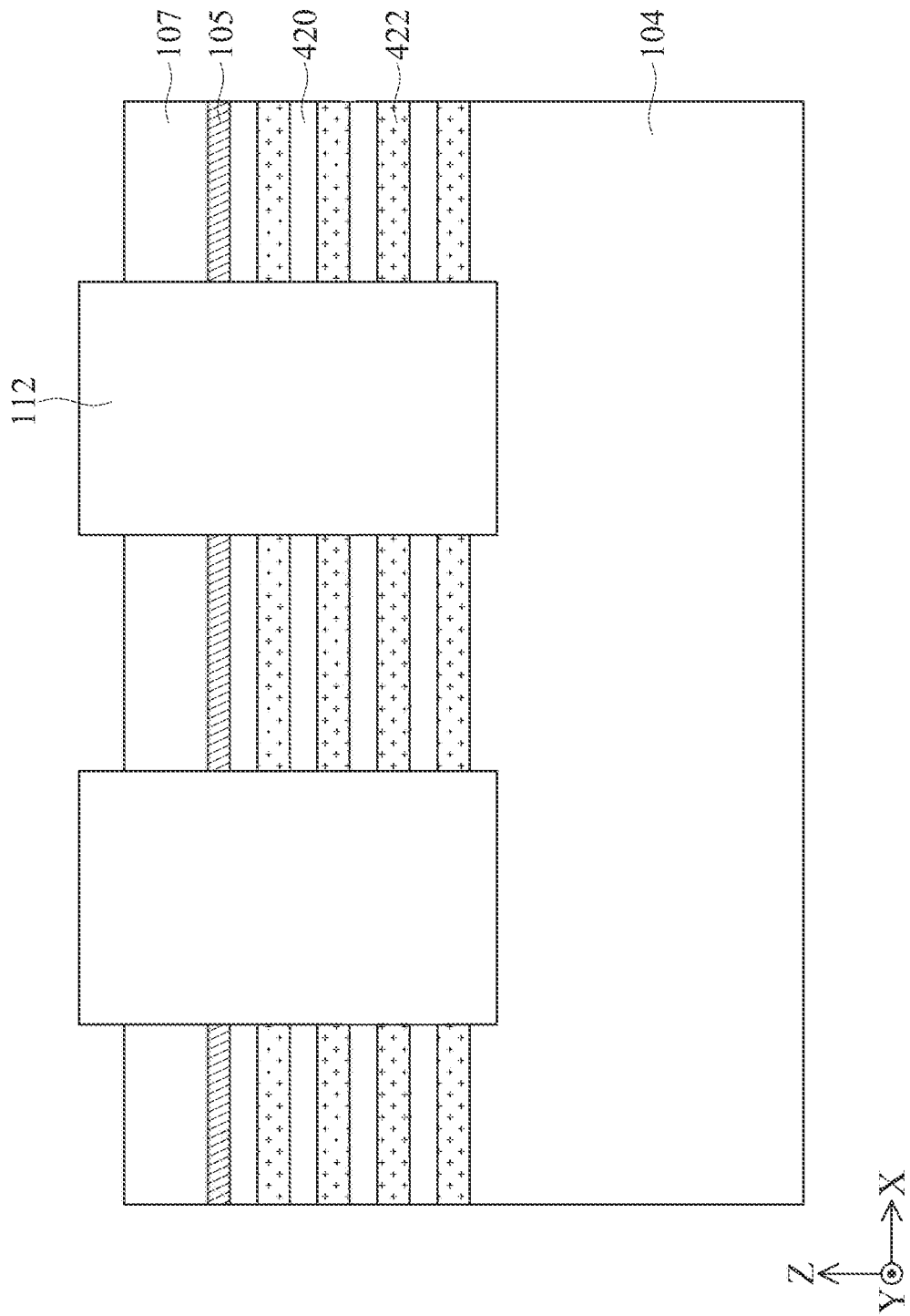

In some embodiments, the formation of fin structures 108 can be followed by the formation of gate structures 112, as shown in FIGS. 30A-30C. Gate structures 112 can be blanket deposited on fin structures 108 by CVD, PVD, and other suitable deposition methods. In some embodiments, gate structures 112 can be formed by blanket deposition of amorphous silicon or polysilicon, followed by photolithography and etching of the deposited polysilicon. Amorphous silicon or polysilicon can be replaced by metal gate structures in subsequent processes.

Figure 31C:
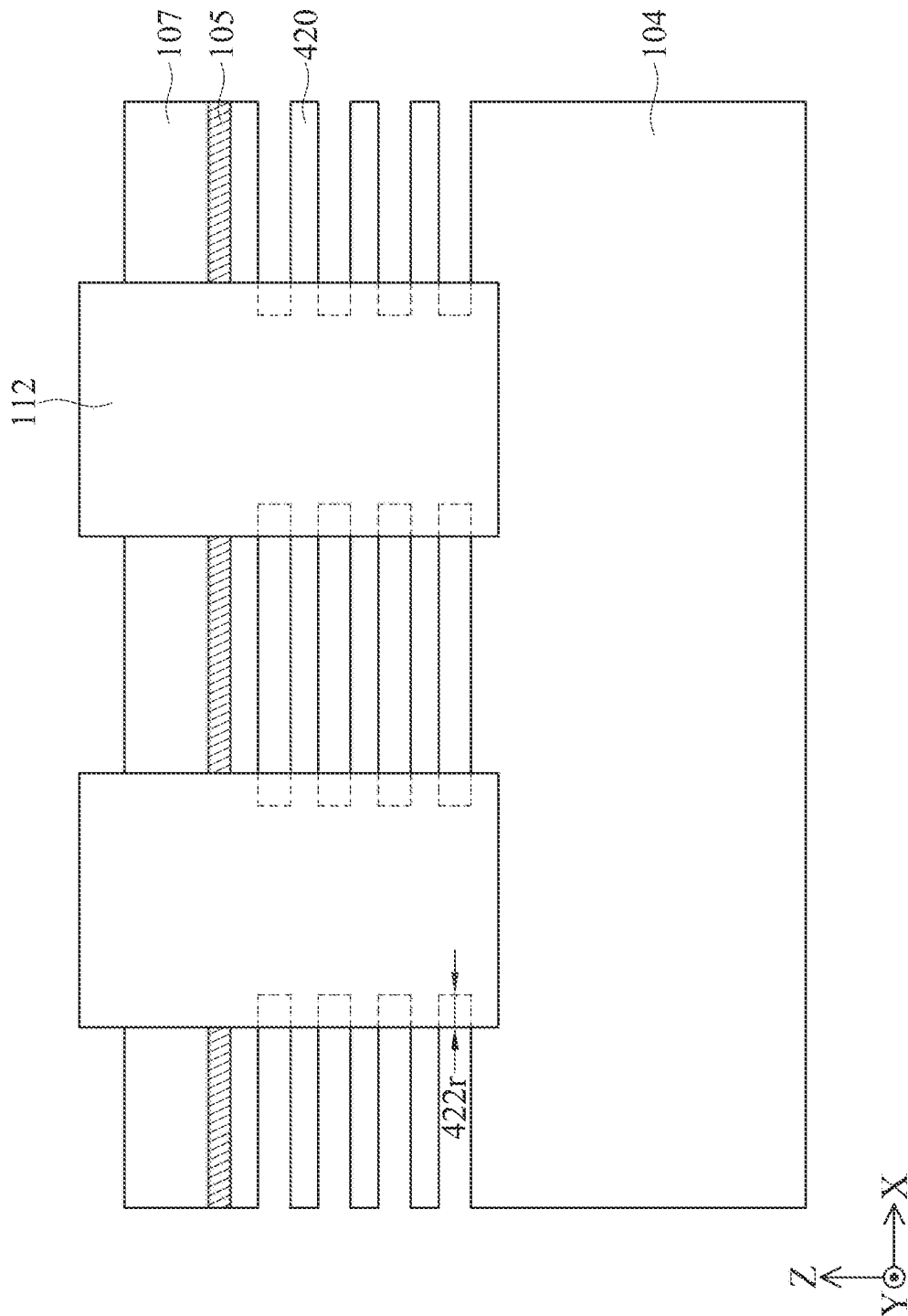

The formation of gate structures 112 can be followed by removal of second semiconductor layers 422, as shown in FIGS. 31A-31C. In some embodiments, second semiconductor layers 422 not underlying gate structures 112 can be removed by an etch process. In some embodiments the etch process can be homogeneous and etch laterally to remove second semiconductor layers 422. Second semiconductor layers 422 under gate structures 112 can be undercut during the etch process. In some embodiments, after the etch process, a recess 422*r* along an X-axis due to the undercut can range from about 3 nm to about 10 nm.

Figure 32B:
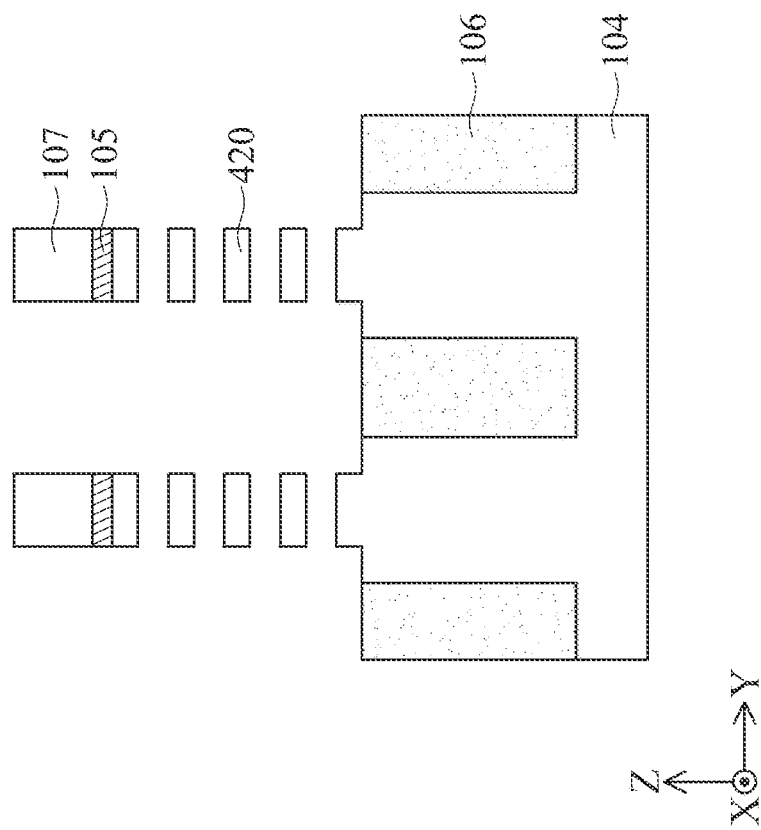
Figure 32A:
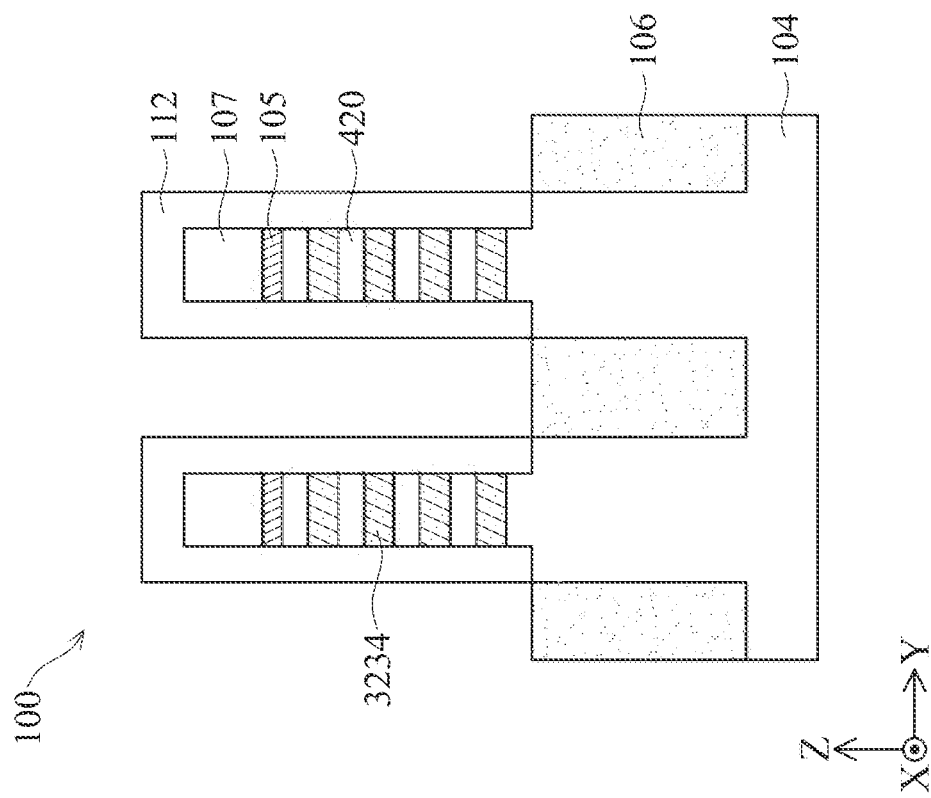
Figure 32C:
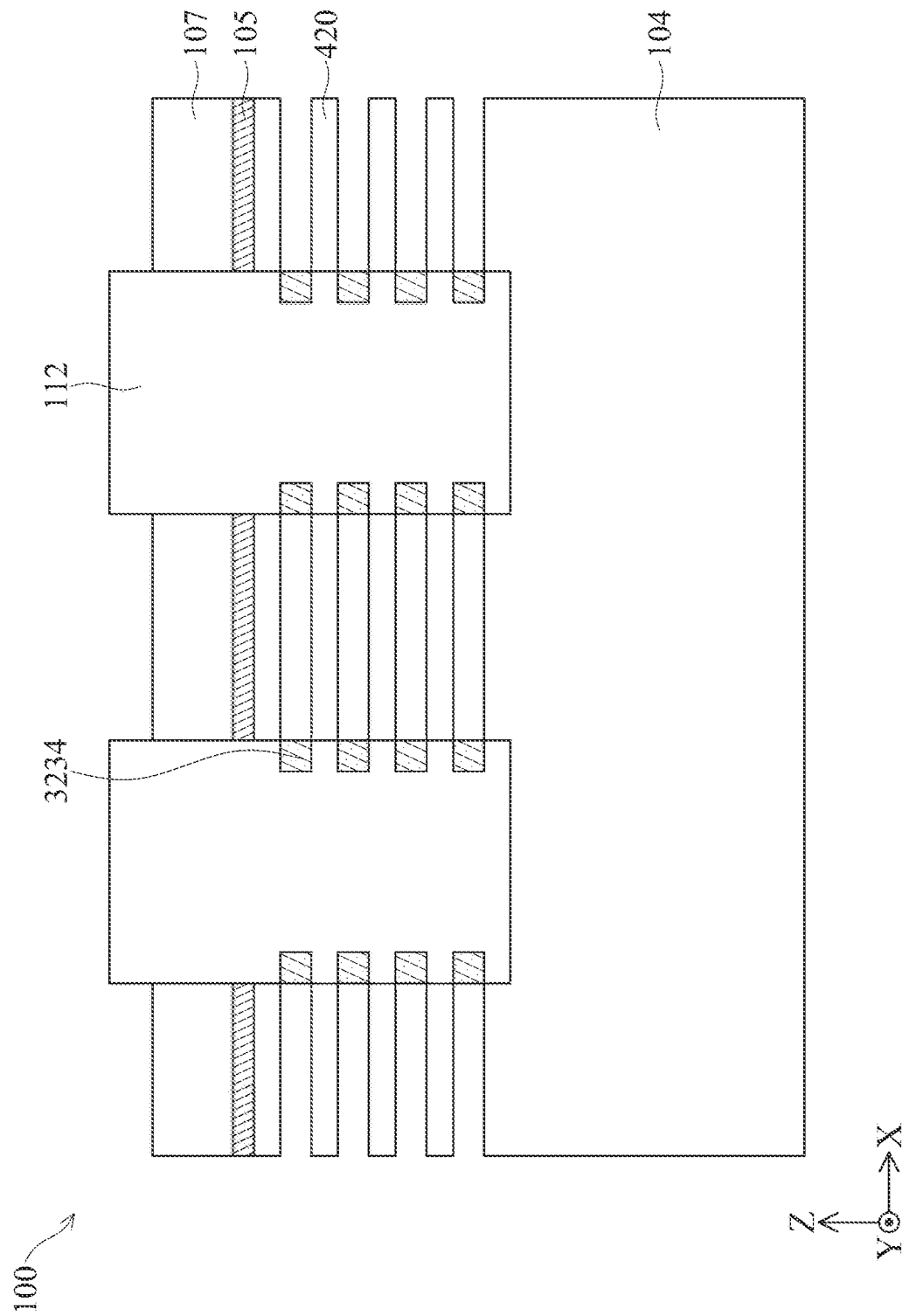
Figure 33C:
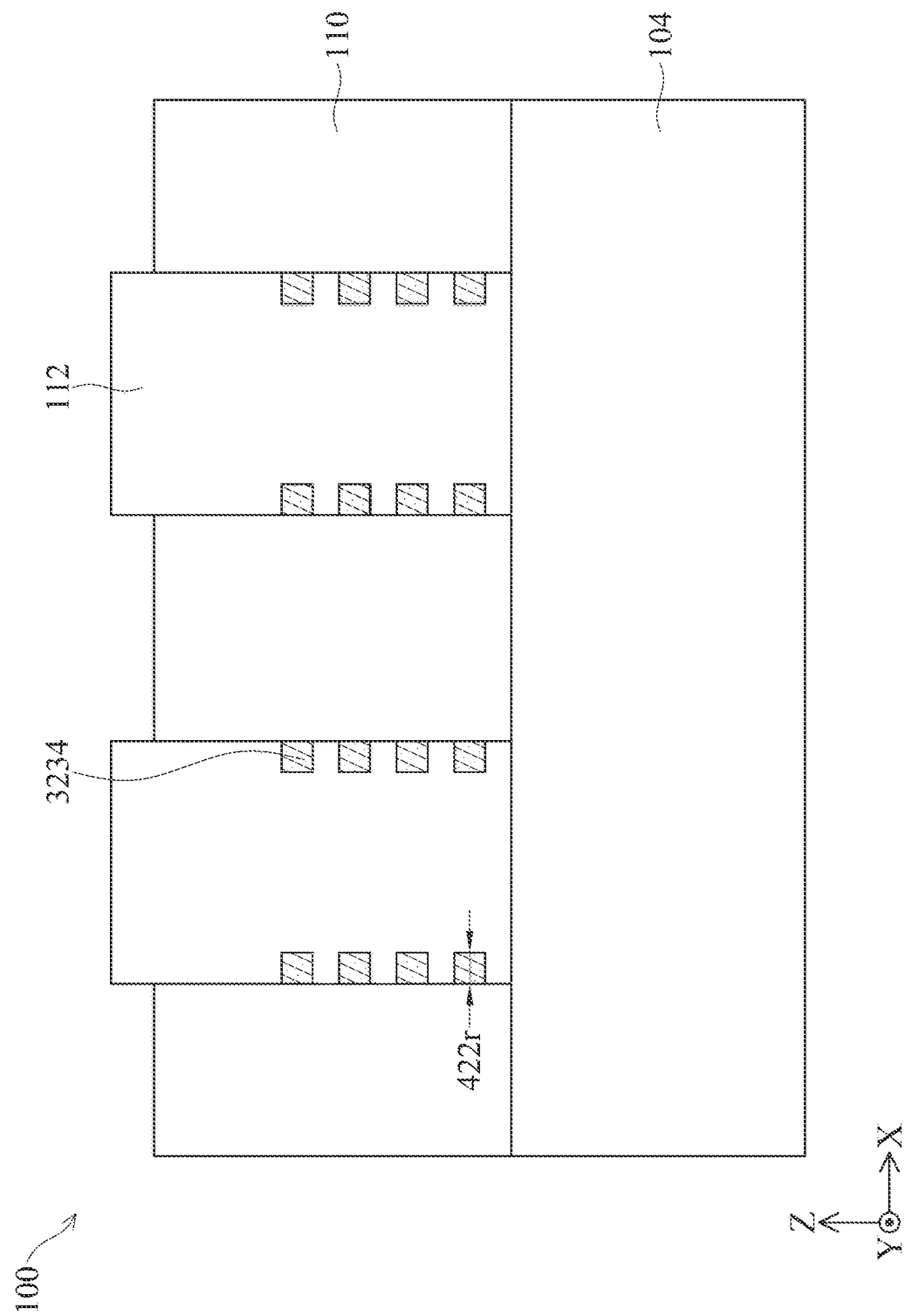

The removal of second semiconductor layers 422 can be followed by the formation of inner spacer structures 3234 in recess 422*r*, as shown in FIGS. 32A-32C. The formation of inner spacer structures 3234 can include a blanket deposition of inner spacer material and a later etch to remove the inner spacer material on first semiconductor layers 420. Inner spacer structures 3234 can be formed in recess 422*r* and separate gate structures 112 and subsequently formed S/D epitaxial structures 110.

The formation of inner spacer structures 3234 can be followed by the formation of S/D epitaxial structures 110, as shown in FIGS. 5 and 33A-33C. In some embodiments, facet-free S/D epitaxial structures 110 can be conformally formed on the top surface of amorphous layer 107, sidewall surfaces of amorphous layer 107, dielectric layer 105, wrapped around first semiconductor layers 420, and on top surfaces 108-1*ts*. S/D epitaxial structures 110 in FIGS. 5 and 33A-33C can be epitaxially grown by a method similar to S/D epitaxial structures 110 in FIG. 2. As second semiconductor layers 422 are removed, facet-free SID epitaxial structures 110 can wrap around first semiconductor layers 420, which can further decrease contact resistance between first semiconductor layers 420 and S/D epitaxial structures 110.

With the control of amorphous layer 107, fin top portions 108-2, and fin bottom portions 108-1, facet-free S/D epitaxial structures 110 with a substantially uniform thickness can be conformally formed on amorphous layer 107 and fin structures 108 to improve device performance and process yield of semiconductor device 100. In some embodiments, facet-free S/D epitaxial structures 110 can wrapped around first semiconductor layers 420 to decrease contact resistance. In some embodiments, semiconductor device 100 having facet-free S/D epitaxial structures 110 with a substantially uniform thickness can improve process yield by about 2% to about 20% and improve device performance by about 2% to about 10%.

Various embodiments in the present disclosure provide example methods 600, 1300, and 2300 for forming facet-free S/D epitaxial structures 110 in field effect transistors (FET) devices (e.g., finFETs, gate-all-around FETs, etc.) and/or other semiconductor devices in an integrated circuit (IC). The example methods in the present disclosure can form fin structures 108 with dielectric layer 105 and amorphous layer 107 on fin structures 108. A portion of amorphous layer 107, a portion of dielectric layer 105, and a portion of fin structures 108 can be removed to expose top surface 108-1*ts* of fin bottom portions 108-1. Facet-free S/D epitaxial structures 110 with a substantially uniform thickness can be conformally formed on amorphous layer 107, dielectric layer 105, fin top portions 108-2, and top surface 108-1*ts* of fin bottom portions 108-1. Top surface 108-1*ts* of fin bottom portions 108-1 can be wider than bottom surface 108-2*bs* of fin top portions 108-2. With the control of amorphous layer 107 and fin top and bottom portions 108-1 and 108-2, facet-free S/D epitaxial structures 110 with a substantially uniform thickness can be conformally formed to improve device performance and process yield.

In some embodiments, a semiconductor device includes a fin structure on a substrate. The fin structure includes a fin bottom portion and a fin top portion and a top surface of the fin bottom portion is wider than a bottom surface of the fin top portion. The semiconductor device further includes a dielectric layer on the fin top portion, an amorphous layer on the dielectric layer, and an epitaxial layer on a top surface of the amorphous layer, sidewall surfaces of the amorphous layer, the dielectric layer, the fin top portion, and the top surface of the fin bottom portion.

In some embodiments, a semiconductor device includes a fin structure on a substrate and an isolation structure on the substrate and adjacent to the fin structure. The fin structure includes a fin bottom portion and a fin top portion. A top surface of the isolation structure is coplanar with a top surface of the fin bottom portion. The semiconductor device further includes a dielectric layer on the fin top portion, an amorphous layer on the dielectric layer, and an epitaxial layer on a top surface of the amorphous layer, sidewall surfaces of the amorphous layer, the dielectric layer, the fin top portion, and the top surface of the fin bottom portion.

In some embodiments, a method includes forming a dielectric layer on a substrate, forming an amorphous layer on the dielectric layer, forming a fin structure on the substrate. The dielectric layer and the amorphous layer are on the fin structure. The method further includes removing a portion of the amorphous layer, a portion of the dielectric layer, and a portion of the fin structure to expose top surfaces of a bottom portion of the fin structure.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a fin structure on a substrate, wherein the fin structure comprises a fin bottom portion and a fin top portion, and wherein a top surface of the fin bottom portion is wider than a bottom surface of the fin top portion;
   a dielectric layer on the fin top portion;
   an amorphous layer on the dielectric layer; and
   an epitaxial layer on a top surface of the amorphous layer, sidewall surfaces of the amorphous layer, the dielectric layer, the fin top portion, and the top surface of the fin bottom portion.

2. The semiconductor device of claim 1, wherein the epitaxial layer is facet-free and has a substantially uniform thickness on the amorphous layer, the fin top portion, and the fin bottom portion.

3. The semiconductor device of claim 1, wherein the fin bottom portion is in contact with the fin top portion and the epitaxial layer.

4. The semiconductor device of claim 1, wherein a ratio of a thickness of the epitaxial layer to a width of the fin bottom portion ranges from about 0.05 to about 0.5.

5. The semiconductor device of claim 1, wherein a ratio of a width of the fin top portion to a width of the fin bottom portion ranges from about 0.1 to about 0.9.

6. The semiconductor device of claim 1, further comprising a gate structure on the fin top portion adjacent to the epitaxial layer.

7. The semiconductor device of claim 1, further comprising an additional fin structure adjacent to the fin structure, wherein:
   the additional fin structure comprises an additional fin bottom portion and an additional fin top portion,
   a top surface of the additional fin bottom portion is wider than a bottom surface of the additional fin top portion, and
   the additional fin structure comprises a dopant different from the fin structure.

8. The semiconductor device of claim 1, wherein the fin top portion comprises a plurality of semiconductor layers, and wherein the epitaxial layer is on sidewall surfaces of the plurality of semiconductor layers.

9. The semiconductor device of claim 1, wherein the fin top portion comprises a plurality of semiconductor layers, and wherein the epitaxial layer wraps around the plurality of semiconductor layers.

10. The semiconductor device of claim 1, wherein the dielectric layer comprises silicon oxide and the amorphous layer comprises silicon.

11. The semiconductor device of claim 1, wherein a thickness of the dielectric layer ranges from about 0.5 nm to about 3 nm and a thickness of the amorphous layer ranges from about 3 nm to about 20 nm.

12. A semiconductor device, comprising:
    a fin structure on a substrate, wherein the fin structure comprises a fin bottom portion and a fin top portion;
    an isolation structure on the substrate and adjacent to the fin structure, wherein a top surface of the isolation structure is coplanar with a top surface of the fin bottom portion;
    a dielectric layer on the fin top portion;
    an amorphous layer on the dielectric layer; and
    an epitaxial layer on a top surface of the amorphous layer, sidewall surfaces of the amorphous layer, the dielectric layer, the fin top portion, and the top surface of the fin bottom portion.

13. The semiconductor device of claim 12, wherein the epitaxial layer is facet-free and has a substantially uniform thickness on the amorphous layer, the fin top portion, and the fin bottom portion.

14. The semiconductor device of claim 12, wherein a ratio of a thickness of the epitaxial layer to a width of the fin bottom portion ranges from about 0.05 to about 0.5.

15. The semiconductor device of claim 12, wherein the fin bottom portion is in contact with the fin top portion and the epitaxial layer.

16. The semiconductor device of claim 12, wherein the dielectric layer comprises silicon oxide and the amorphous layer comprises silicon.

17. A method, comprising:
    forming a dielectric layer on a substrate;
    forming an amorphous layer on the dielectric layer;
    forming a fin structure on the substrate, wherein the dielectric layer and the amorphous layer are on the fin structure; and
    removing a portion of the amorphous layer, a portion of the dielectric layer, and a portion of the fin structure to expose top surfaces of a bottom portion of the fin structure.

18. The method of claim 17, further comprising conformally forming an epitaxial layer on a top surface of the amorphous layer, sidewall surfaces of the amorphous layer, the dielectric layer, a top portion of the fin structure, and the top surfaces of the bottom portion.

19. The method of claim 17, wherein forming the fin structure comprises anisotropically etching the amorphous layer, the dielectric layer, and the substrate.

20. The method of claim 17, wherein removing the portion of the amorphous, the portion of the dielectric layer, and the portion of the fin structure comprises anisotropically etching the amorphous layer, the dielectric layer, and the fin structure.

* * * * *

UNITED STATES PATENT AND TRADEMARK OFFICE
CERTIFICATE OF CORRECTION

PATENT NO. : 11,901,412 B2
APPLICATION NO. : 17/461178
DATED : February 13, 2024
INVENTOR(S) : Chen et al.

Page 1 of 1

It is certified that error appears in the above-identified patent and that said Letters Patent is hereby corrected as shown below:

On the Title Page

Item (72), in "Inventors", Line 1, delete "Winne" and insert -- Winnie --, therefor.

In the Specification

In Column 2, Line 38, delete "+1%," and insert -- ±1%, --, therefor.

In Column 2, Line 38, delete "+4%, +5%," and insert -- ±4%, ±5%, --, therefor.

In Column 7, Line 3, delete "SID" and insert -- S/D --, therefor.

In Column 7, Line 3, delete "SID" and insert -- S/D --, therefor.

In Column 7, Line 9, delete "SID" and insert -- S/D --, therefor.

In Column 7, Line 14, delete "SID" and insert -- S/D --, therefor.

In Column 8, Line 20, delete "SID" and insert -- S/D --, therefor.

In Column 8, Line 67, delete "SID" and insert -- S/D --, therefor.

In Column 10, Line 33, delete "(SFS)," and insert -- ($SF_6$), --, therefor.

In Column 19, Line 56, delete "SID" and insert -- S/D --, therefor.

Signed and Sealed this
Eleventh Day of March, 2025

Coke Morgan Stewart
*Acting Director of the United States Patent and Trademark Office*